(12) United States Patent
Kato et al.

(10) Patent No.: US 9,059,689 B2
(45) Date of Patent: Jun. 16, 2015

(54) SEMICONDUCTOR DEVICE INCLUDING FLIP-FLOP AND LOGIC CIRCUIT

(71) Applicant: Semiconductor Energy Laboratory Co., Ltd., Atsugi-shi, Kanagawa-ken (JP)

(72) Inventors: Kiyoshi Kato, Kanagawa (JP); Wataru Uesugi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/160,774

(22) Filed: Jan. 22, 2014

(65) Prior Publication Data

US 2014/0203859 A1 Jul. 24, 2014

(30) Foreign Application Priority Data

Jan. 24, 2013 (JP) ................................. 2013-010783

(51) Int. Cl.
*H03K 5/04* (2006.01)
*H03K 5/06* (2006.01)
*H03K 5/05* (2006.01)
*H03K 5/00* (2006.01)

(52) U.S. Cl.
CPC .. *H03K 5/06* (2013.01); *H03K 5/05* (2013.01); *H03K 2005/00104* (2013.01); *H03K 2005/00241* (2013.01)

(58) Field of Classification Search
USPC .......................... 327/264, 376, 377, 387, 393
See application file for complete search history.

(56) References Cited

U.S. PATENT DOCUMENTS

| 5,731,856 | A | 3/1998 | Kim et al. |
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |

(Continued)

FOREIGN PATENT DOCUMENTS

| EP | 1 737 044 A1 | 12/2006 |
| EP | 2 226 847 A2 | 9/2010 |

(Continued)

OTHER PUBLICATIONS

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

(Continued)

*Primary Examiner* — An Luu
(74) *Attorney, Agent, or Firm* — Fish & Richardson P.C.

(57) ABSTRACT

To provide a semiconductor device capable of adjusting the timing of a clock signal or a high-quality semiconductor device. The semiconductor device includes a first transistor and a circuit including a second transistor. A channel of the first transistor is formed in an oxide semiconductor layer. A first signal is input to one of a source and a drain of the first transistor. The other of the source and the drain of the first transistor is electrically connected to a gate of the second transistor. A first clock signal is input to the circuit. The circuit outputs a second clock signal. The timing of the second clock signal is different from that of the first clock signal.

8 Claims, 19 Drawing Sheets

(56) References Cited

U.S. PATENT DOCUMENTS

| | | | |
|---|---|---|---|
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,382,170 B2 | 6/2008 | Pollock | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,363,452 B2 * | 1/2013 | Yamazaki et al. | 365/149 |
| 8,385,105 B2 * | 2/2013 | Saito | 365/149 |
| 8,467,231 B2 * | 6/2013 | Matsuzaki et al. | 365/149 |
| 8,624,650 B2 * | 1/2014 | Ishii | 327/202 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0101332 A1 | 5/2011 | Yamazaki et al. | |
| 2012/0230138 A1 * | 9/2012 | Endo | 365/203 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 10-124553 A | 5/1998 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-288788 A | 11/2007 |
| WO | 2004/114391 A1 | 12/2004 |

OTHER PUBLICATIONS

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

(56) References Cited

OTHER PUBLICATIONS

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 with Sputtered Al2O3 Gate insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

(56) References Cited

OTHER PUBLICATIONS

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide—Based Thin-Film Transistors by DC Sputtering," SID Digest '09 : SID International Symposium Digest of Technical Papers, May 31, 2009, pp. 191-193.

Li C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTs With a Novel Passivation Layer," SID Digest '09 : SID International Symposium Digest of Technical Papers, May 31, 2009, pp. 284-287.

\* cited by examiner

SEMICONDUCTOR DEVICE INCLUDING FLIP-FLOP AND LOGIC CIRCUIT

BACKGROUND OF THE INVENTION

1. Field of the Invention

The present invention relates to an object, a method, or a manufacturing method. In addition, the present invention relates to a process, a machine, manufacture, or a composition of matter. In particular, the present invention relates to, for example, a semiconductor device, a display device, a light-emitting device, a power storage device, a driving method thereof, or a manufacturing method thereof. The present invention particularly relates to a semiconductor device, a display device, or a light-emitting device each including an oxide semiconductor, for example.

2. Description of the Related Art

Patent Document 1 discloses a circuit that includes a plurality of clock buffers and adjusts the timing of a clock signal.

[Reference]

Patent Document 1: Japanese Published Patent Application No. H10-124553

SUMMARY OF THE INVENTION

An object of one embodiment of the present invention is to provide a semiconductor device capable of adjusting the timing of a clock signal. Another object of one embodiment of the present invention is to provide a high-quality semiconductor device or the like.

An object of one embodiment of the present invention is to provide a semiconductor device or the like with low off-state current. Another object of one embodiment of the present invention is to provide a semiconductor device or the like with low power consumption. Another object of one embodiment of the present invention is to provide an eye-friendly display device or the like. Another object of one embodiment of the present invention is to provide a semiconductor device or the like including a transparent semiconductor layer. Another object of one embodiment of the present invention is to provide a semiconductor device or the like including a semiconductor layer with high reliability.

Note that the descriptions of these objects do not disturb the existence of other objects. In one embodiment of the present invention, there is no need to achieve all the objects. Other objects will be apparent from and can be derived from the description of the specification, the drawings, the claims, and the like.

A semiconductor device of one embodiment of the present invention includes a first transistor and a circuit including a second transistor. A region where a channel is formed (also referred to as channel formation region) in the first transistor is included in an oxide semiconductor layer. A first signal is input to one of a source and a drain of the first transistor. The other of the source and the drain of the first transistor is electrically connected to a gate of the second transistor. A first clock signal is input to the circuit. A second clock signal is output from the circuit. The timing of the second clock signal is different from that of the first clock signal.

In the semiconductor device of one embodiment of the present invention, it is preferable to adjust the timing of the second clock signal by changing an output current of the second transistor by the first signal.

A semiconductor device of one embodiment of the present invention includes a first transistor and a second transistor. A channel formation region of the first transistor is included in an oxide semiconductor layer. A first signal is input to one of a source and a drain of the first transistor. The other of the source and the drain of the first transistor is electrically connected to a gate of the second transistor. A first clock signal is input to one of a source and a drain of the second transistor. A second clock signal is output from the other of the source and the drain of the second transistor. The timing of the second clock signal is different from that of the first clock signal.

A semiconductor device of one embodiment of the present invention includes a first transistor, a second transistor, a first inverter, and a second inverter. A channel formation region of the first transistor is included in an oxide semiconductor layer. A first signal is input to one of a source and a drain of the first transistor. The other of the source and the drain of the first transistor is electrically connected to a gate of the second transistor. A first clock signal is input to one of a source and a drain of the second transistor through the first inverter. A second clock signal is output from the other of the source and the drain of the second transistor through the second inverter. The timing of the second clock signal is different from that of the first clock signal.

A semiconductor device of one embodiment of the present invention includes a first transistor, a second transistor, a first inverter, a second inverter, and a capacitor. A channel formation region of the first transistor is included in an oxide semiconductor layer. A first signal is input to one of a source and a drain of the first transistor. The other of the source and the drain of the first transistor is electrically connected to a gate of the second transistor. A first clock signal is input to one of a source and a drain of the second transistor and the second inverter through the first inverter. The other of the source and the drain of the second transistor is electrically connected to one of electrodes of the capacitor. A second clock signal is output from the second inverter. The timing of the second clock signal is different from that of the first clock signal.

A semiconductor device of one embodiment of the present invention includes a first transistor, a circuit comprising a second transistor, a flip-flop, and a logic circuit. A channel formation region of the first transistor is included in an oxide semiconductor layer. An output of the logic circuit is input to a gate of the first transistor. A first signal is input to one of a source and a drain of the first transistor. The other of the source and the drain of the first transistor is electrically connected to a gate of the second transistor. A first clock signal is input to the circuit. A second clock signal is output from the circuit to the flip-flop. A second signal and an output signal of the flip-flop are input to the logic circuit. The timing of the second clock signal is different from that of the first clock signal.

In the semiconductor device of one embodiment of the present invention, the timing of a clock signal can be adjusted.

The semiconductor device of one embodiment of the present invention includes a transistor in which a channel formation region is included in an oxide semiconductor layer. Consequently, a potential corresponding to a signal for adjusting the timing of the clock signal can be held while the transistor is off.

The semiconductor device of one embodiment of the present invention can use an analog signal as the signal for adjusting the timing of the clock signal, and thus make fine adjustments to the clock signal.

In the semiconductor device of one embodiment of the present invention, the clock signal can be adjusted even after a logic circuit is fabricated. The timing of the clock signal can be adjusted when a delay time or a time lag between the rising edges of clock signals is detected by a combinational circuit.

DETAILED DESCRIPTION OF THE INVENTION

Figure 1A:
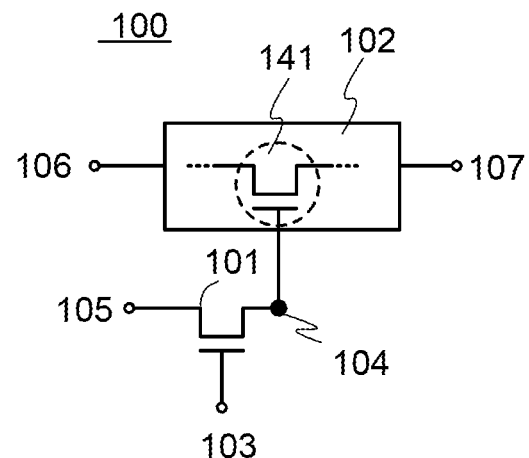
FIGS. 1A and 1B are circuit diagrams of semiconductor devices.

Embodiments of the present invention will be described below with reference to the drawings. Note that the present invention is not limited to the following description. It will be readily appreciated by those skilled in the art that various changes and modifications are possible without departing from the spirit and scope of the present invention. Therefore, the present invention should not be construed as being limited to the following description of the embodiments. Note that in describing structures of the present invention with reference to the drawings, reference numerals denoting the same portions are used in common in different drawings.

[Embodiment 1]

FIG. 1A illustrates a semiconductor device 100. The semiconductor device 100 includes a transistor 101 and a circuit 102. The circuit 102 includes at least a transistor 141.

A signal 103 is input to a gate of the transistor 101. The on/off state of the transistor 101 is controlled by the signal 103. A signal 105 is input to one of a source and a drain of the transistor 101. The other of the source and the drain of the transistor 101 is electrically connected to a gate of the transistor 141, and the signal 105 is output to the gate of the transistor 141.

In the transistor 101, a region where a channel is formed (i.e., channel formation region) is included in an oxide semiconductor layer.

A clock signal 106 is input to the circuit 102. The circuit 102 outputs a clock signal 107.

Figure 2:
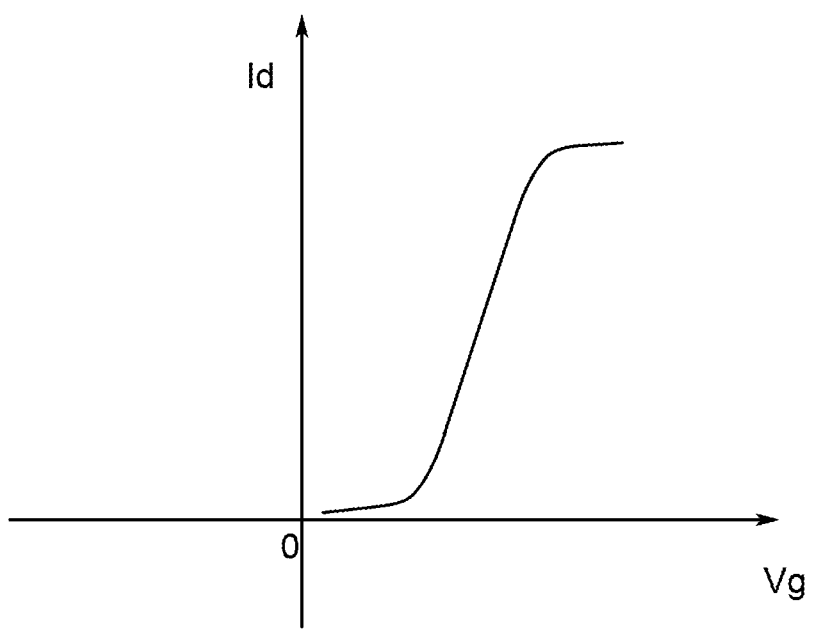
FIG. 2 shows current-voltage characteristics.

FIG. 2 shows current-voltage (Id-Vg) characteristics of the transistor 141. The current Id changes depending on the potential (Vg) of the signal 105; accordingly, the transistor 141 can be regarded as a variable resistor (R). Note that the transistor 141 may be provided on a silicon-based semiconductor substrate. Alternatively, a channel of the transistor 141 may be formed in an oxide semiconductor layer.

Figure 3:
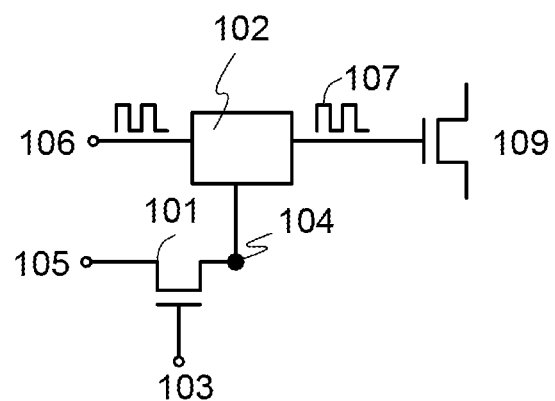
FIG. 3 is a circuit diagram of a semiconductor device.

The clock signal 107 is usually input to a gate of a transistor 109 included in a flip-flop, for example (FIG. 3).

Figure 4:
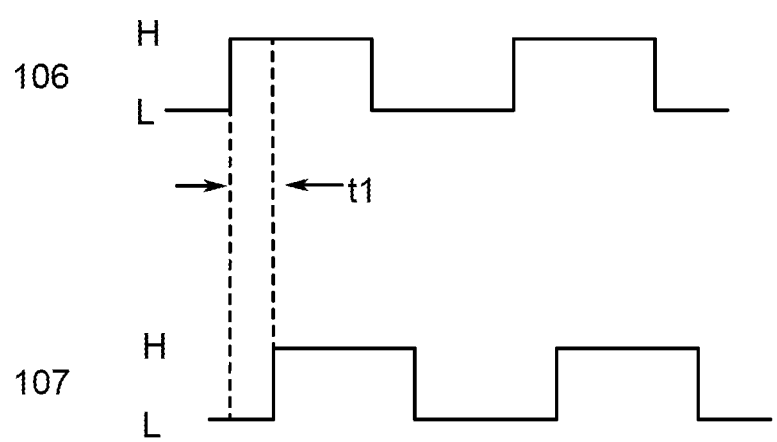
FIG. 4 is a timing chart.

The resistance (R) of the transistor 141 changes depending on the potential of the signal 105. Using this resistance (R) as a factor causing propagation delay of the clock signal, the timing of the clock signal 107 can be adjusted. FIG. 4 is a schematic timing diagram of the clock signal 106 and the clock signal 107. The timing of the rising edge of the clock signal 107 varies from that of the clock signal 106 by t1 (FIG. 4); t1 can be changed in accordance with the potential of the signal 105.

The operation of the semiconductor device 100 will be described.

The signal 103 is input to the transistor 101, and the transistor 101 is turned on. At this time, the signal 105 is input to one of the source and the drain of the transistor 101 and then input to the gate of the transistor 141. The signal 105 can be an analog signal corresponding to the adjustment amount of the timing of the clock signal 107. An analog signal is capable of making fine adjustments to the clock signal 107.

Next, the transistor 101 is turned off by the signal 103. Since the channel formation region of the transistor 101 is included in the oxide semiconductor layer, the off-state current of the transistor 101 is extremely low. Thus, a potential corresponding to the signal 105 is held at a node 104, and this potential keeps being applied to the gate of the transistor 141. That is, the signal 105 for adjusting the timing of the clock signal 107 can be held without change.

The clock signal 106 is input to the circuit 102. Since the current of the transistor 141 changes depending on the potential of the signal 105, the clock signal 107 whose timing of the rising edge is adjusted is output from the circuit 102.

Figure 1B:
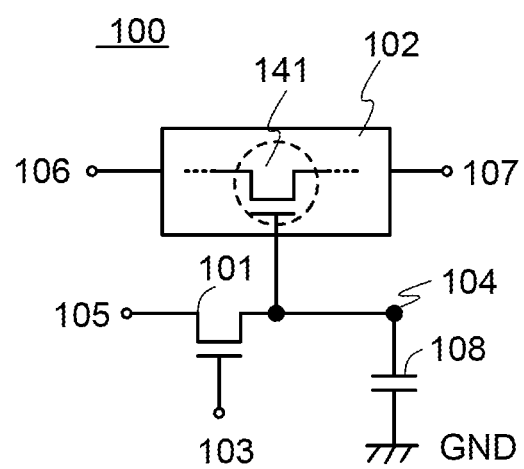

Note that a capacitor 108 may be provided as illustrated in FIG. 1B. With the capacitor 108, the potential of the node 104 can be held more reliably.

Figure 5:
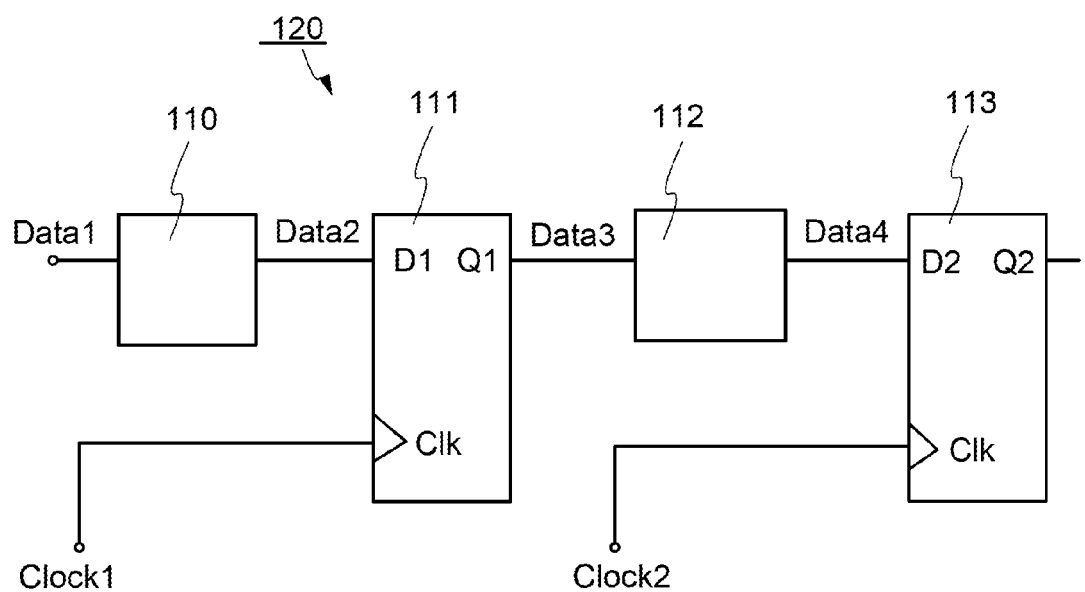
FIG. 5 is a circuit diagram of a semiconductor device.
Figure 6:
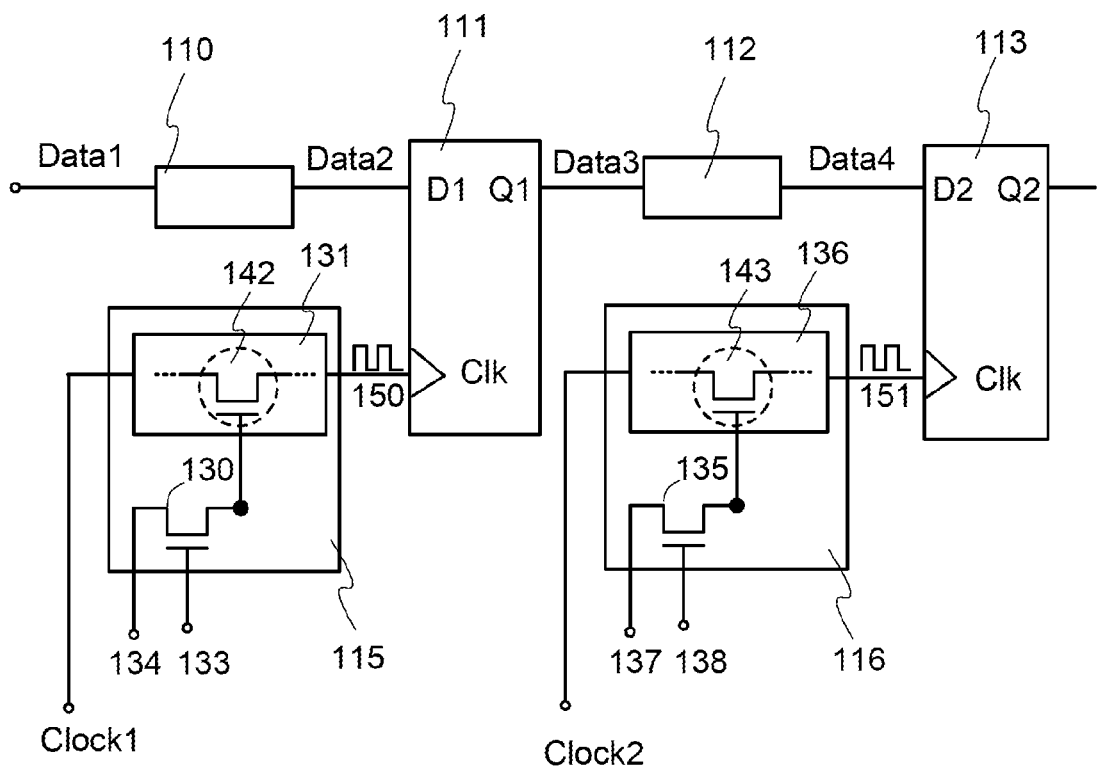
FIG. 6 is a circuit diagram of a semiconductor device.

FIG. 5 illustrates a semiconductor device 120 including a combinational circuit 110, a flip-flop 111, a combinational circuit 112, and a flip-flop 113. FIG. 6 illustrates a semiconductor device 125 including the combinational circuit 110, the flip-flop 111, the combinational circuit 112, the flip-flop 113, a semiconductor device 115, and a semiconductor device 116. The semiconductor devices 115 and 116 have a structure similar to that of the semiconductor device 100 in FIG. 1A. Note that the flip-flops 111 and 113 and the combinational circuits 110 and 112 can be known circuits.

The semiconductor device 115 includes a transistor 130 and a circuit 131. The circuit 131 includes at least a transistor 142.

A signal 133 is input to a gate of the transistor 130. A signal 134 is input to one of a source and a drain of the transistor 130. The other of the source and the drain of the transistor 130 is electrically connected to a gate of the transistor 142.

A clock signal 1 is input to the circuit 131, and a clock signal 150 whose timing of the rising edge is adjusted is output to the flip-flop 111.

The semiconductor device 116 includes a transistor 135 and a circuit 136. The circuit 136 includes at least a transistor 143.

A signal 138 is input to a gate of the transistor 135. A signal 137 is input to one of a source and a drain of the transistor 135. The other of the source and the drain of the transistor 135 is electrically connected to a gate of the transistor 143.

A clock signal 2 is input to the circuit 136, and a clock signal 151 whose timing of the rising edge is adjusted is output to the flip-flop 113.

Data 1 is input to the combinational circuit 110, and data 2 is output from the combinational circuit 110. The data 2 is input to the flip-flop 111, and data 3 is output from the flip-flop 111. The data 3 is input to the combinational circuit 112, and data 4 is output from the combinational circuit 112. The data 4 is input to the flip-flop 113, and data 5 is output from the flip-flop 113. The data 5 is input to a subsequent combinational circuit 114 (not illustrated).

Figure 7A:
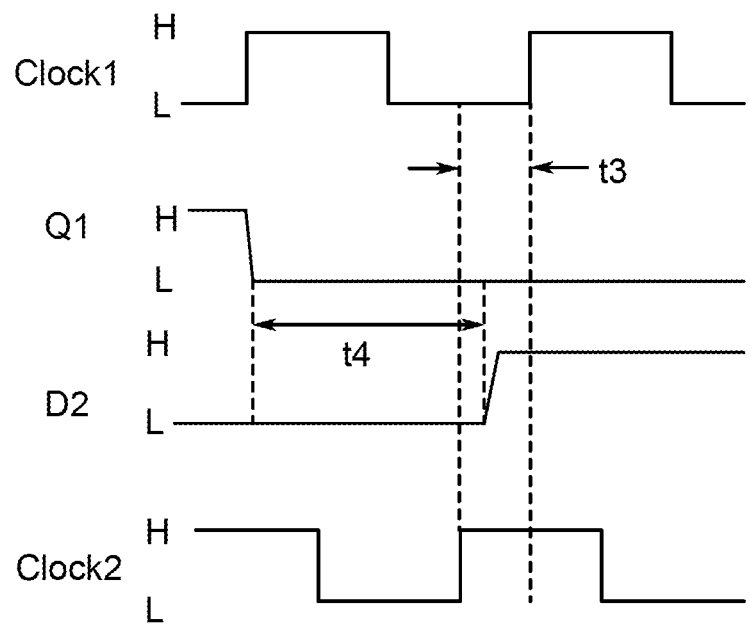
FIGS. 7A and 7B are timing charts.

In the semiconductor device 120 in FIG. 5, there may be a time lag (t3) between the rising edges of the clock signal 1 and the clock signal 2, and t3 may deviate significantly from a delay time (t4) that occurs between the output (Q1) from the flip-flop 111 and the input (D2) to the flip-flop 113 because of the combinational circuit 112. As a result, in FIG. 7A, t3+t4 exceeds one clock cycle; this is a setup violation, and the data 4 is not input correctly to the flip-flop 113.

Figure 7B:
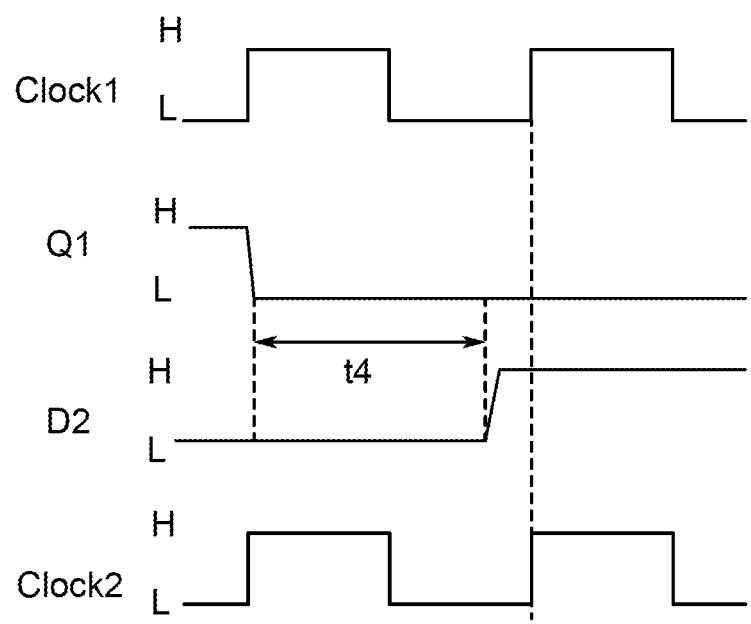

In contrast, in the semiconductor device 125 in FIG. 6, the timing of the clock signal can be adjusted. Accordingly, the timing of the clock signal 2 is shifted by the semiconductor device 116 to decrease t3, whereby t3+t4 can be less than one clock cycle. As a result, the data 4 can be input correctly to the flip-flop 113 (FIG. 7B).

Figure 8A:
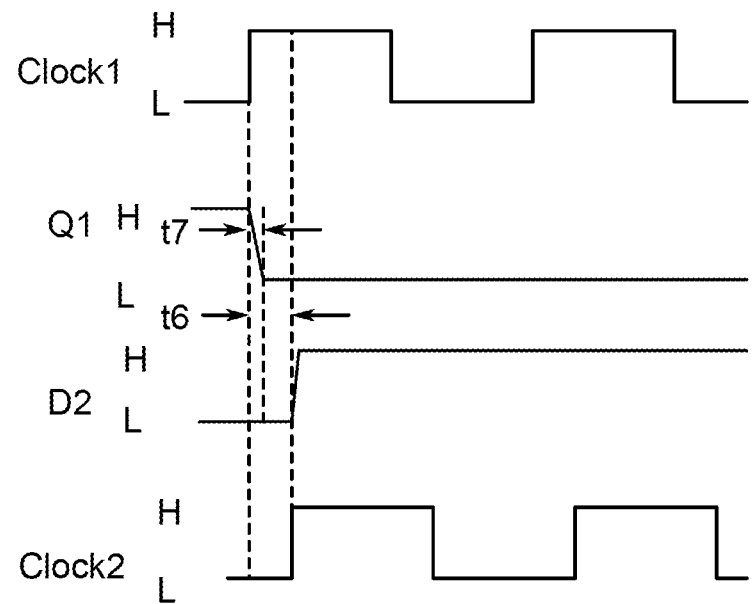
FIGS. 8A and 8B are timing charts.

Further, in the semiconductor device 120 in FIG. 5, there may be a time lag (t6) between the rising edges of the clock signal 1 and the clock signal 2, and t6 may deviate from a delay time (t7) that occurs between the output (Q1) from the flip-flop 111 and the input (D2) to the flip-flop 113 because of the combinational circuit 112. In FIG. 8A, t7 is shorter than t6; this is a hold violation, and the data 4 is not input correctly to the flip-flop 113.

Figure 8B:
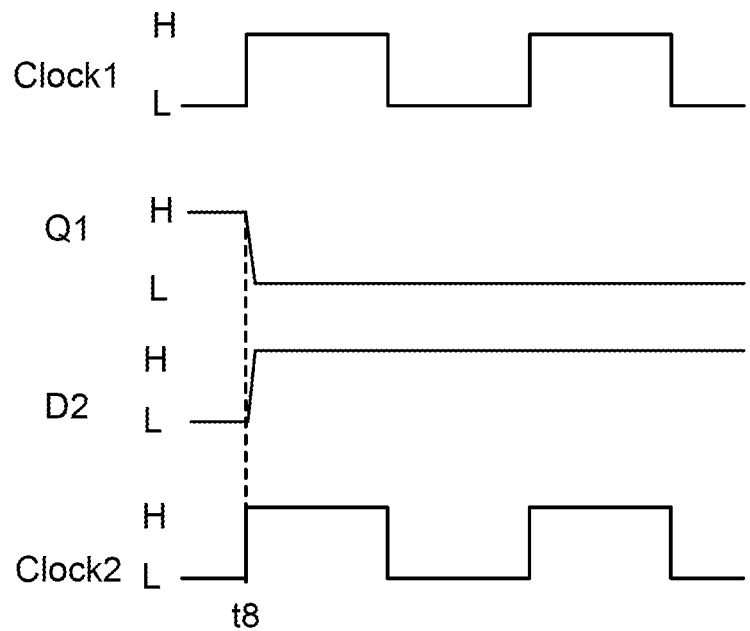

In this case, when the timing of the clock signal 2 is shifted by the semiconductor device 116 so that the clock signal 2 makes a low to high transition at time t8, the data 4 can be input correctly to the flip-flop 113 (FIG. 8B).

In the fabricated semiconductor device 125, the delay time may be different from the designed one because of the combinational circuits 110 and 112 or the like. Moreover, the time lag between the rising edges of the clock signal 1 and the clock signal 2 may be different from the designed one. These differences may lead to a malfunction of the semiconductor device 125. However, the clock signals 150 and 151 can be adjusted in the semiconductor device 125, whereby a malfunction of the semiconductor device 125 is not caused.

[Embodiment 2]

Figure 9A:
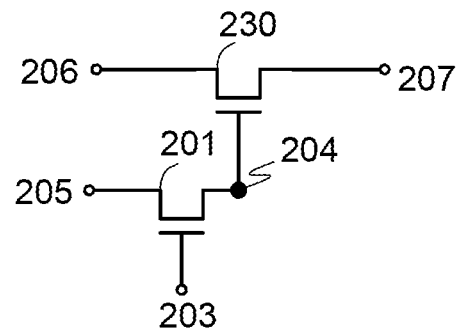
FIGS. 9A and 9B are circuit diagrams of semiconductor devices.

FIG. 9A illustrates a semiconductor device 200 that is one embodiment of the present invention. The semiconductor device 200 includes a transistor 201 and a transistor 230.

A signal 203 is input to a gate of the transistor 201. The on/off state of the transistor 201 is controlled by the signal 203. A signal 205 is input to one of a source and a drain of the transistor 201. The other of the source and the drain of the transistor 201 is electrically connected to a gate of the transistor 230.

A potential corresponding to the signal 205 is applied to the gate of the transistor 230. A clock signal 206 is input to one of a source and a drain of the transistor 230. When the transistor 230 is on, a clock signal 207 is output from the other of the source and the drain of the transistor 230. Although the transistor 230 may be either an n-channel transistor or a p-channel transistor, the case of the n-channel transistor 230 is described below. Note that the transistor 230 may be provided on a silicon-based semiconductor substrate. Alternatively, a channel of the transistor 230 may be formed in an oxide semiconductor layer.

FIG. 2 shows Id-Vg characteristics of the transistor 230. The current Id changes depending on the potential (Vg) of the signal 205 (FIG. 2); accordingly, the transistor 230 can be regarded as a variable resistor (R). A resistance (R) can be estimated from the Id-Vg characteristics of the transistor 230.

Figure 10:
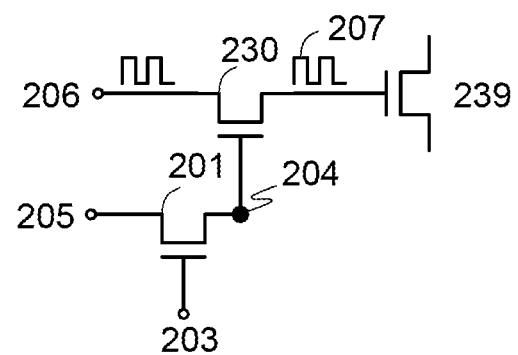
FIG. 10 is a circuit diagram of a semiconductor device.

The clock signal 207 is output from the other of the source and the drain of the transistor 230. The outputted clock signal 207 is usually input to a gate of a transistor 239 included in a flip-flop, for example (FIG. 10).

In consideration of a gate capacitance (C) of the transistor 239, a time constant ($\tau$) determining the rise time of the clock signal 207 is estimated from the formula $\tau$=RC. Note that R is determined by the Id-Vg characteristics of the transistor 230.

Figure 11A:
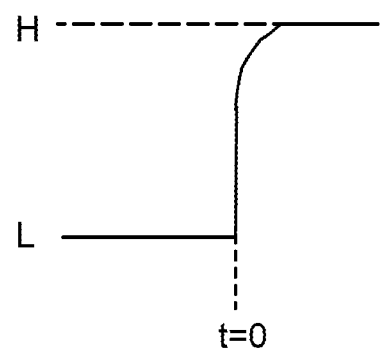
FIGS. 11A and 11B are timing charts.
Figure 11B:
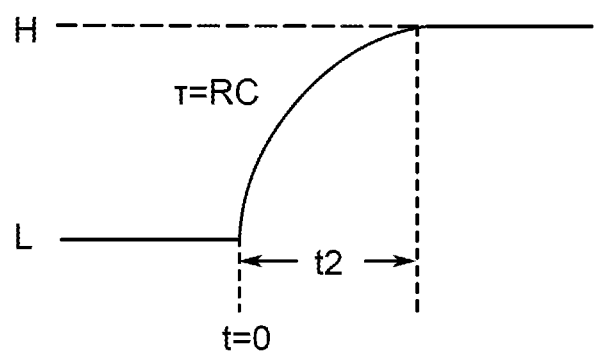

In the case where the transistor 230 is not provided, as shown in FIG. 11A, the low (L) to high (H) transition is sharper than that in FIG. 11B. The clock signal changes from low to high at t=0.

In the case where the transistor 230 is provided, the low (L) to high (H) transition is slow in accordance with a larger time constant (t) as shown in FIG. 11B. The clock signal rises slowly from low level at t=0 and reaches high level at t=t2. Note that t2 can be changed in accordance with the potential of the signal 205.

The time constant can be changed when Id of the transistor 230 is changed by the signal 205; thus, the timing of the clock signal 207 can be adjusted.

Figure 9B:
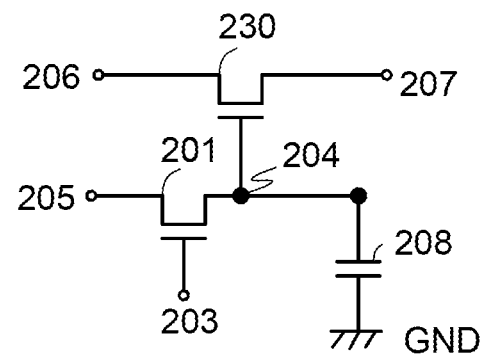

Note that a capacitor 208 may be provided as illustrated in FIG. 9B, in which case the potential of a node 204 can be held more reliably.

The operation of the semiconductor device 200 will be described.

The signal 203 is input to the transistor 201, and the transistor 201 is turned on. At this time, the signal 205 is input to one of the source and the drain of the transistor 201 and then input to the gate of the transistor 230. The signal 205 can be an analog signal corresponding to the adjustment amount of the timing of the clock signal 207. An analog signal is capable of making fine adjustments to the clock signal 207.

Next, the transistor 201 is turned off by the signal 203. Since the off-state current of the transistor 201 is extremely low, a potential corresponding to the signal 205 is held at the node 204, and this potential keeps being applied to the gate of the transistor 230. That is, the signal 205 for adjusting the timing of the clock signal 207 can be held without change.

The clock signal 206 is input the transistor 230. The current Id of the transistor 230 changes depending on the potential (Vg) of the signal 205. The clock signal 207 whose timing of the rising edge is adjusted is output from the transistor 230.

Figure 12:
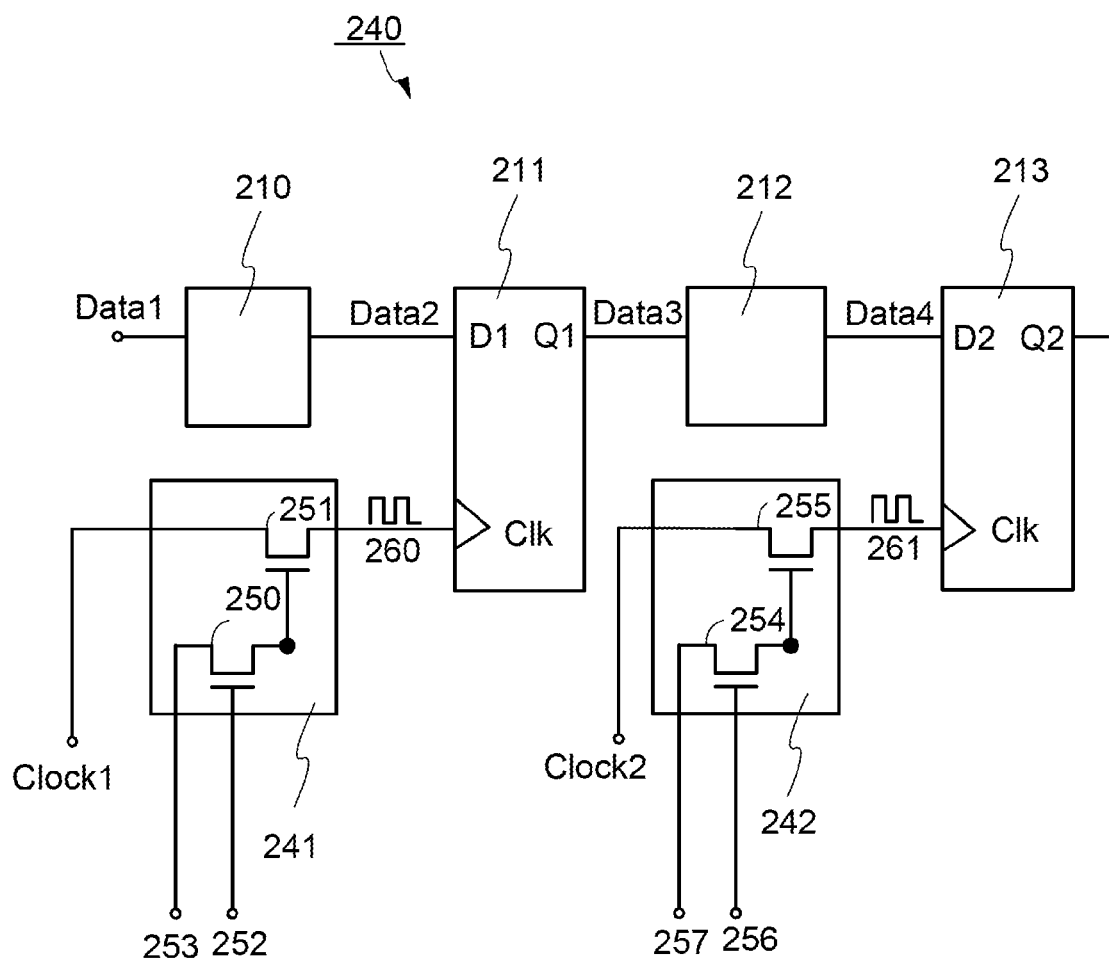
FIG. 12 is a circuit diagram of a semiconductor device.

FIG. 12 illustrates a semiconductor device 240 including a combinational circuit 210, a flip-flop 211, a combinational circuit 212, a flip-flop 213, a semiconductor device 241, and a semiconductor device 242. The semiconductor device 241 includes a transistor 250 and a transistor 251. The semiconductor device 242 includes a transistor 254 and a transistor 255. The semiconductor devices 241 and 242 have a structure similar to that of the semiconductor device 200 in FIG. 9A. Note that the flip-flops 211 and 213 can be known flip-flops, and the combinational circuits 210 and 212 can be known circuits.

Data 1 is input to the combinational circuit 210, and data 2 is output from the combinational circuit 210. The data 2 is input to the flip-flop 211, and data 3 is output from the flip-flop 211. The data 3 is input to the combinational circuit 212, and data 4 is output from the combinational circuit 212. The data 4 is input to the flip-flop 213, and data 5 is output from the flip-flop 213. The data 5 is input to a subsequent combinational circuit 214 (not illustrated).

A signal 252 is input to a gate of the transistor 250. A signal 253 is input to one of a source and a drain of the transistor 250. The other of the source and the drain of the transistor 250 is electrically connected to a gate of the transistor 251. A clock signal 1 is input to one of a source and a drain of the transistor 251. A clock signal 260 whose timing of the rising edge is adjusted is output from the other of the source and the drain of the transistor 251 to the flip-flop 211.

A signal 256 is input to a gate of the transistor 254. A signal 257 is input to one of a source and a drain of the transistor 254. The other of the source and the drain of the transistor 254 is electrically connected to a gate of the transistor 255. A clock signal 2 is input to one of a source and a drain of the transistor 255. A clock signal 261 whose timing of the rising edge is adjusted is output from the other of the source and the drain of the transistor 255 to the flip-flop 213.

Since the semiconductor device 240 includes the semiconductor devices 241 and 242, the timings of the clock signals 260 and 261 can be adjusted as described in Embodiment 1 when there occurs a time lag between the rising edges of the clock signal 1 and the clock signal 2 or a delay time between the output (Q1) from the flip-flop 211 and the input (D2) to the flip-flop 213. Thus, the semiconductor device 240 can operate normally.

[Embodiment 3]

Figure 13:
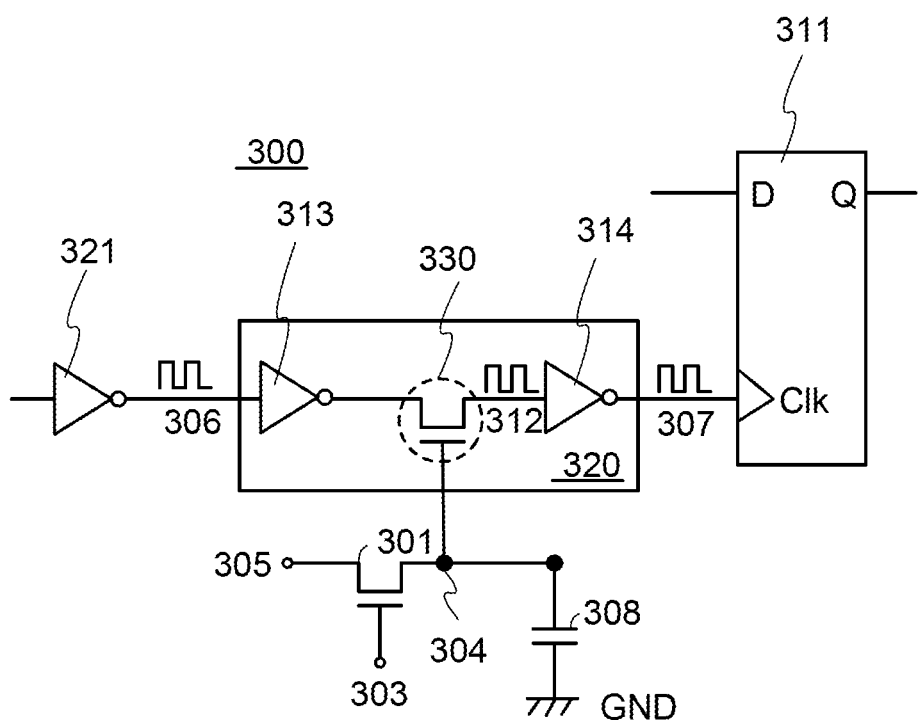
FIG. 13 is a circuit diagram of a semiconductor device.

In the semiconductor device 240 shown in Embodiment 2, the time constant determining the rise time of the clock signal depends on the gate capacitance (input capacitance) of the flip-flops 211 and 213. Here, a semiconductor device that does not depend on the input capacitance of a flip-flop will be shown. FIG. 13 illustrates a semiconductor device 300 that is one embodiment of the present invention. The semiconductor device 300 includes a transistor 301 and a semiconductor device 320. The semiconductor device 320 corresponds to the circuit 102 in Embodiment 1.

The semiconductor device 320 includes an inverter 313, a transistor 330, and an inverter 314.

A signal 303 is input to a gate of the transistor 301. A signal 305 is input to one of a source and a drain of the transistor 301. The other of the source and the drain of the transistor 301 is electrically connected to a gate of the transistor 330.

A potential (Vg) corresponding to the signal 305 is applied to the gate of the transistor 330. A clock signal 306 is input to one of a source and a drain of the transistor 330 through the inverter 313. A clock signal 312 is output from the other of the source and the drain of the transistor 330 and input to the inverter 314. A clock signal 307 is output from the inverter 314. That is, the clock signal 306 is input to the semiconductor device 320, and the clock signal 307 is output from the semiconductor device 320.

Although the transistor 330 may be either an n-channel transistor or a p-channel transistor, the case of the n-channel transistor 330 is described below. Note that the transistor 330, the inverter 313, and the inverter 314 may be provided on a silicon-based semiconductor substrate. Alternatively, a channel formation region of the transistor 330 may be included in an oxide semiconductor layer.

Although the clock signal 306 is input to the inverter 313 from the inverter 321 in FIG. 13, the inverter 321 may be provided as needed.

The clock signal 307 is input to a flip-flop 311.

Note that a capacitor 308 can be provided as needed. With the capacitor 308, the potential of a node 304 can be held more reliably.

The current Id of the transistor 330 changes depending on the potential (Vg) of the signal 305. The time constant (t) determining the rise time of the clock signal 312 output from the transistor 330 depends on a gate capacitance (C) of a transistor in the inverter 314. Thus, the time constant can be determined only by the semiconductor device 320, so that the clock signal 307 can be adjusted without depending on the gate capacitance of a transistor (input capacitance) of the flip-flop 311 as in Embodiment 2.

Figure 14:
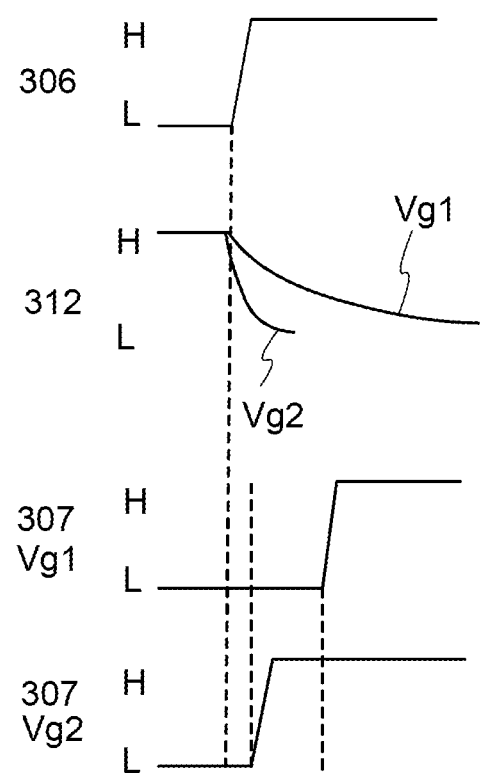
FIG. 14 is a timing chart.

For example, in the case where the gate capacitance of the transistor in the inverter 314 is set as appropriate, the clock signal 312 can fall slowly as shown in FIG. 14 when the potential (Vg) of the signal 305 is low (when Vg=Vg1). When the potential (Vg) of the signal 305 is high (when Vg=Vg2), the clock signal 312 can fall more sharply than when Vg=Vg1 as shown in FIG. 14.

Accordingly, the timing of the rising edge of the clock signal 307 output from the inverter 314 can be retarded largely (Vg1) or retarded a little (Vg2).

The operation of the semiconductor device 300 will be described.

The signal 303 is input to the transistor 301, and the transistor 301 is turned on. At this time, the signal 305 is input to one of the source and the drain of the transistor 301 and then input to the gate of the transistor 330. The signal 305 can be an analog signal corresponding to the adjustment amount of the timing of the clock signal 307. An analog signal is capable of making fine adjustments to the clock signal 307.

Next, the transistor 301 is turned off by the signal 303. Since the off-state current of the transistor 301 is extremely low, a potential corresponding to the signal 305 is held at the node 304, and this potential keeps being applied to the gate of the transistor 330. That is, the signal 305 for adjusting the timing of the clock signal 307 can be held without change.

The clock signal 306 is input to the transistor 330 through the inverter 313. The current Id of the transistor 330 changes depending on the potential of the signal 305. As described above, the clock signal 312 whose timing of the rising edge is adjusted is output from the transistor 330 and input to the inverter 314. The clock signal 307 is output from the inverter 314.

[Embodiment 4]

Figure 15:
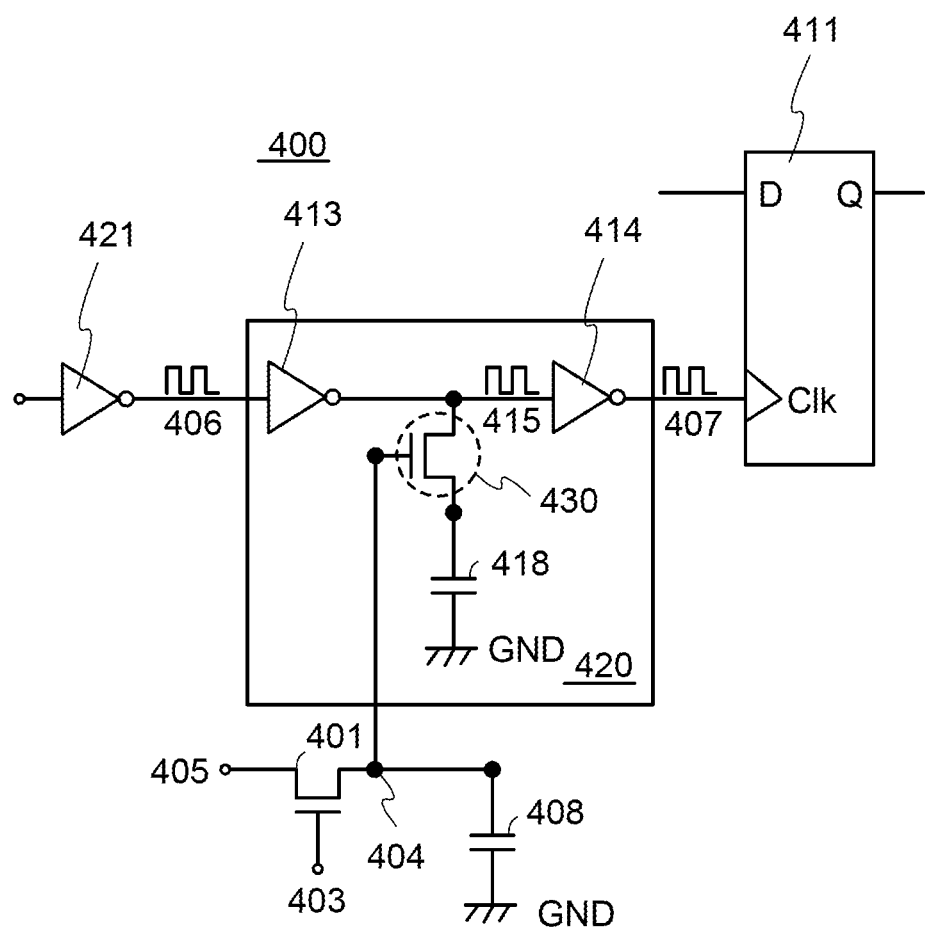
FIG. 15 is a circuit diagram of a semiconductor device.

FIG. 15 illustrates a semiconductor device 400 that is one embodiment of the present invention. The semiconductor device 400 includes a transistor 401 and a semiconductor device 420. The semiconductor device 420 corresponds to the circuit 102 in Embodiment 1.

The semiconductor device 420 includes an inverter 413, a transistor 430, an inverter 414, and a capacitor 418.

A signal 403 is input to a gate of the transistor 401. A signal 405 is input to one of a source and a drain of the transistor 401. The other of the source and the drain of the transistor 401 is electrically connected to a gate of the transistor 430.

A potential corresponding to the signal 405 is applied to the gate of the transistor 430. One of a source and a drain of the transistor 430 is electrically connected to an output of the inverter 413. The other of the source and the drain of the transistor 430 is electrically connected to one electrode of the capacitor 418.

A clock signal 406 is input to the inverter 413. A clock signal 415 is output from the inverter 413. The clock signal 415 is input to the inverter 414. A clock signal 407 is output from the inverter 414.

Although the transistor 430 may be either an n-channel transistor or a p-channel transistor, the case of the n-channel transistor 430 is described below. Note that the transistor 430, the inverter 413, and the inverter 414 may be provided on a silicon-based semiconductor substrate. Alternatively, a channel formation region of the transistor 430 may be included in an oxide semiconductor layer.

Although the clock signal 406 is input to the inverter 413 from the inverter 421 in FIG. 15, the inverter 421 may be provided as needed.

The clock signal 407 is input to a flip-flop 411.

Note that a capacitor 408 can be provided as needed. With the capacitor 408, the potential of a node 404 can be held more reliably.

When the transistor 430 is off, the clock signal 415 is input to the inverter 414.

When the transistor 430 is on, the clock signal 415 is input to one of the source and the drain of the transistor 430 as well as the inverter 414. Then, the clock signal 415 is also input to the capacitor 418.

Accordingly, when the transistor 430 is on, charge of the clock signal 415 output from the inverter 413 is held at the capacitor 418 through the transistor 430 as well as by the input capacitance of the inverter 414. Thus, the timing of turning on the inverter 414 is delayed, whereby the timing of the clock signal 407 can be adjusted.

The current Id of the transistor 430 changes depending on the potential (Vg) of the signal 405; accordingly, the transistor 430 can be regarded as a variable resistor (R). The amount of charge held at the capacitor 418 can be adjusted by changing the resistance of the transistor 430. Thus, the time before the inverter 414 is turned on can be adjusted, and the timing of the clock signal 407 can be adjusted as a result.

The operation of the semiconductor device 400 will be described.

The signal 403 is input to the transistor 401, and the transistor 401 is turned on. At this time, the signal 405 is input to one of the source and the drain of the transistor 401 and then input to the gate of the transistor 430. The signal 405 can be an analog signal corresponding to the adjustment amount of the timing of the clock signal 407. An analog signal is capable of making fine adjustments to the clock signal 407.

Next, the transistor 401 is turned off by the signal 403. Since the off-state current of the transistor 401 is extremely low, a potential corresponding to the signal 405 is held at the node 404, and this potential keeps being applied to the gate of the transistor 430. That is, the signal 405 for adjusting the timing of the clock signal 407 can be held without change.

The clock signal 406 is input to the inverter 413. The inverter 413 outputs the clock signal 415. The clock signal 415 is input to the inverter 414, one of the source and the drain of the transistor 430, and the capacitor 418. At this time, charge is held at the capacitor 418 in accordance with the resistance of the transistor 430. Thus, the timing of turning on the inverter 414 is delayed, whereby the timing of the clock signal 407 can be adjusted.

[Embodiment 5]

Figure 16:
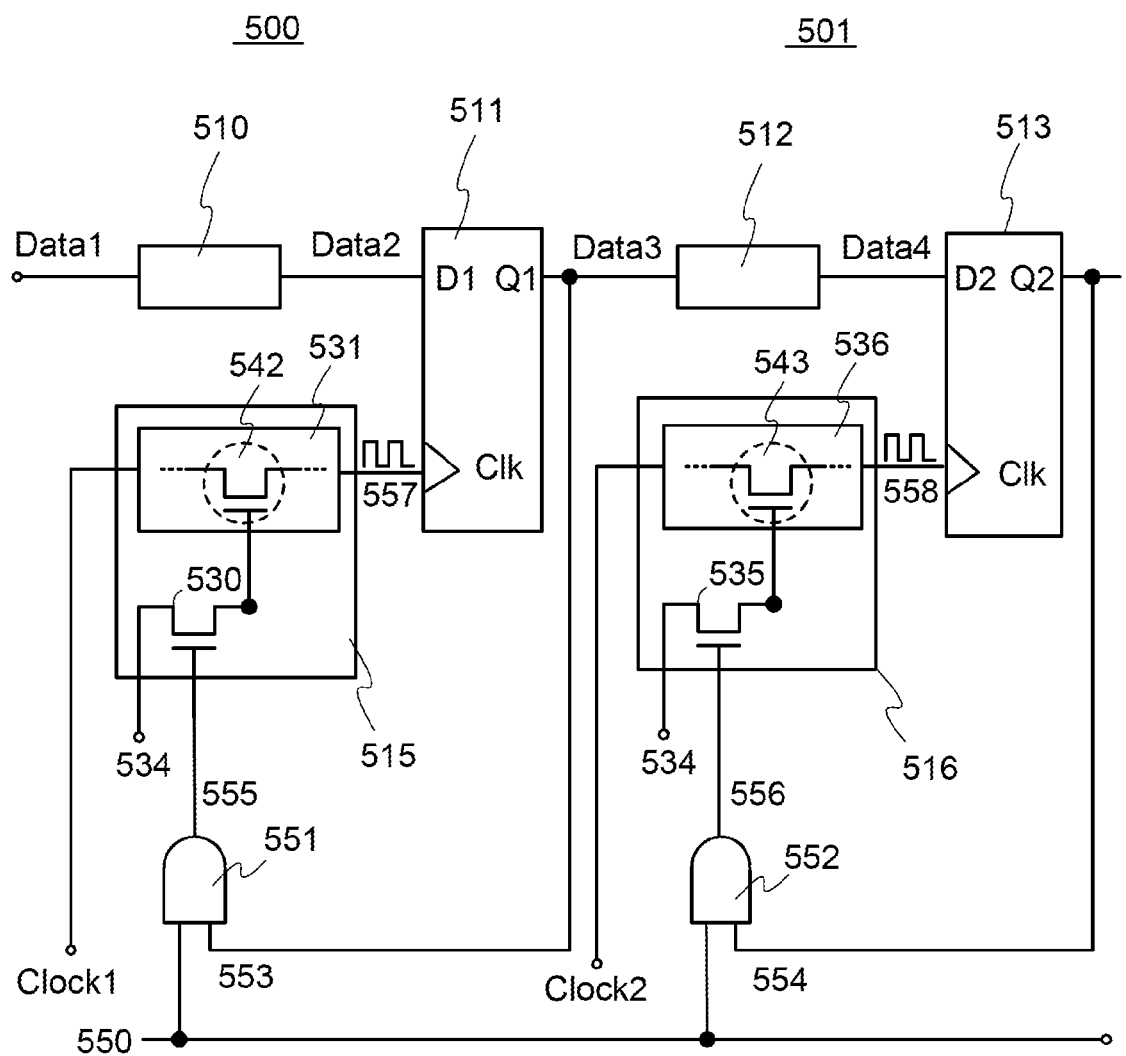
FIG. 16 is a circuit diagram of a semiconductor device.

FIG. 16 illustrates semiconductor devices 500 and 501 of one embodiment of the present invention. Each of the semiconductor devices 500 and 501 can determine whether a clock signal input to a flip-flop is adjusted or not.

The semiconductor device 500 includes a combinational circuit 510, a flip-flop 511, a logic circuit 551, and a semiconductor device 515. The semiconductor device 501 includes a combinational circuit 512, a flip-flop 513, a logic circuit 552, and a semiconductor device 516.

Data 1 is input to the combinational circuit 510, and data 2 is output to the flip-flop 511. Data 3 (a signal 553) is output from the flip-flop 511 to the combinational circuit 512 and the logic circuit 551. Data 4 is output from the combinational circuit 512 to the flip-flop 513. Data (a signal 554) is output from the flip-flop 513 to a subsequent combinational circuit 514 (not illustrated) and the logic circuit 552.

A clock signal 557 whose timing of the rising edge is adjusted is input to the flip-flop 511 from the semiconductor device 515. The semiconductor device 515 includes a transistor 530 and a semiconductor device 531. The semiconductor device 531 corresponds to the circuit 102 in Embodiment 1.

The semiconductor device 531 includes at least a transistor 542.

A signal 555 is input to a gate of the transistor 530 from the logic circuit 551. A signal 534 is input to one of a source and a drain of the transistor 530. The other of the source and the drain of the transistor 530 is electrically connected to a gate of the transistor 542.

A potential corresponding to the signal 534 is applied to the gate of the transistor 542. A clock signal 1 is input to the semiconductor device 531, and a clock signal 557 whose timing of the rising edge is adjusted is output to the flip-flop 511. The way of adjusting the timing of the clock signal 557 is as has been described in Embodiments 1 to 4.

The signal 550 is input to the logic circuit 551. The signal 553 is input to the logic circuit 551 from the flip-flop 511. When the signal 550 and the signal 553 are both high, the signal 555 is set high and the transistor 530 is turned on. When either the signal 550 or the signal 553 is low, the signal 555 is set low and the transistor 530 is turned off.

A clock signal 558 whose timing of the rising edge is adjusted is input to the flip-flop 513 from the semiconductor device 516. The semiconductor device 516 includes a transistor 535 and a semiconductor device 536. The semiconductor device 536 corresponds to the circuit 102 in Embodiment 1.

The semiconductor device 536 includes at least a transistor 543.

A signal 556 is input to a gate of the transistor 535 from the logic circuit 552. The signal 534 is input to one of a source and a drain of the transistor 535. The other of the source and the drain of the transistor 535 is electrically connected to a gate of the transistor 543. The signal 534 is also input to the transistor 530. Although the signal 534 is input to both the transistor 530 and the transistor 535 here, a signal different from a signal input to the transistor 530 may be input to the transistor 535.

A potential corresponding to the signal 534 is applied to the gate of the transistor 543. A clock signal 2 is input to the semiconductor device 536, and a clock signal 558 whose timing of the rising edge is adjusted is output to the flip-flop 513. The way of adjusting the timing of the clock signal 558 is as has been described in Embodiments 1 to 4.

The signal 550 is input to the logic circuit 552. The signal 554 is input to the logic circuit 552 from the flip-flop 513. When the signal 550 and the signal 554 are both high, the signal 556 is set high and the transistor 535 is turned on. When either the signal 550 or the signal 554 is low, the signal 556 is set low and the transistor 535 is turned off.

Here, a method for adjusting a clock signal input to a particular flip-flop will be described. A general processor has a scan chain. Scan chain is a technique of testing sequential circuits effectively and is a kind of shift register constituted by connecting flip-flops in series. The state of any given flip-flop included in the scan chain can be set by input of serial data to the shift register from a dedicated pin.

In order to adjust only the clock signal 557 input to the flip-flop 511, the output (Q1) of the flip-flop 511 is set "1" and the output (Q2) of the other flip-flop 513 is set "0" with the use of the scan chain.

Then, when the level of the signal 550 is changed, the signal 555 is changed in accordance with the signal 550 to have the same level as the signal 550, and the signal 556 is always low ("0"). In other words, the on/off state of the transistor 530 can be controlled, whereas the transistor 535 is always off.

As above, only the clock signal 557 input to the flip-flop 511 can be adjusted.

[Embodiment 6]

An oxide semiconductor that can be used for a channel of the transistors in Embodiments 1 to 5 will be described.

A highly purified oxide semiconductor (purified OS) obtained by reduction of impurities such as moisture or hydrogen which serves as an electron donor (donor) and by reduction of oxygen defects is an intrinsic (i-type) semiconductor or a substantially i-type semiconductor. Thus, a transistor including a channel in a highly purified oxide semiconductor has extremely low off-state current and high reliability.

Specifically, various experiments can prove low off-state current of a transistor including a channel in a highly purified oxide semiconductor. For example, the off-state current of even an element having a channel width of $1 \times 10^6$ μm and a channel length of 10 μm can be less than or equal to the measurement limit of a semiconductor parameter analyzer, that is, less than or equal to $1 \times 10^{-13}$ A at a voltage between the source electrode and the drain electrode (a drain voltage) of 1 V to 10 V. In this case, it can be seen that off-state current standardized on the channel width of the transistor is lower than or equal to 100 zA/μm. In addition, the off-state current is measured using a circuit in which a capacitor and a transistor are connected to each other and charge flowing into or from the capacitor is controlled by the transistor. In the measurement, a highly purified oxide semiconductor film is used for a channel formation region of the transistor, and the off-state current of the transistor is measured from a change in the amount of charge of the capacitor per unit time. As a result, it is found that when the voltage between the source electrode and the drain electrode of the transistor is 3 V, a lower off-state current of several tens of yoctoamperes per micrometer (yA/μm) is obtained. Consequently, the off-state current of the transistor in which a highly purified oxide semiconductor film is used for a channel formation region is much lower than that of a transistor including crystalline silicon.

Unless otherwise specified, in this specification, the off-state current of an n-channel transistor is a current that flows between a source and a drain when the potential of a gate is lower than or equal to 0 with the potential of the source as a reference potential while the potential of the drain is higher than those of the source and the gate. Moreover, in this specification, the off-state current of a p-channel transistor is a current that flows between a source and a drain when the potential of a gate is higher than or equal to 0 with the potential of the source as a reference potential while the potential of the drain is lower than those of the source and the gate.

An oxide semiconductor preferably contains at least indium (In) or zinc (Zn). The oxide semiconductor preferably contains, in addition to In and Zn, gallium (Ga), tin (Sn), hafnium (Hf), aluminum (Al), and/or zirconium (Zr) that serve as a stabilizer for reducing variations in electric characteristics of transistors using the oxide semiconductor.

Among the oxide semiconductors, unlike silicon carbide, gallium nitride, or gallium oxide, In—Ga—Zn-based oxide, In—Sn—Zn-based oxide, or the like has an advantage of high mass productivity because a transistor with favorable electrical characteristics can be formed by sputtering or a wet process. Further, unlike silicon carbide, gallium nitride, or gallium oxide, with the use of the In—Ga—Zn-based oxide, a transistor with favorable electrical characteristics can be formed over a glass substrate, and a larger substrate can be used.

As another stabilizer, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, any of the following oxides can be used, for example: indium oxide, gallium oxide, tin oxide, zinc oxide, In—Zn-based oxide, Sn—Zn-based oxide, Al—Zn-based oxide, Zn—Mg-based oxide, Sn—Mg-based oxide, In—Mg-based oxide, In—Ga-based oxide, In—Ga—Zn-based oxide (also referred to as IGZO), In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—La—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, In—Lu—Zn-based oxide, In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and In—Hf—Al—Zn-based oxide.

Note that, for example, an In—Ga—Zn-based oxide means an oxide containing In, Ga, and Zn and there is no particular limitation on the ratio of In, Ga, and Zn. Further, the In—Ga—Zn-based oxide may contain a metal element other than In, Ga, and Zn. The In—Ga—Zn-based oxide has sufficiently high resistance when no electric field is applied thereto, so that off-state current can be sufficiently reduced. Moreover, the In—Ga—Zn-based oxide has high mobility.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide with an atomic ratio close to any of the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), In:Sn:Zn=2:1:5 (=1/4:1/8:5/8) or an oxide with an atomic ratio close to any of the above atomic ratios may be used.

For example, with an In—Sn—Zn-based oxide, high mobility can be achieved relatively easily. However, even with an In—Ga—Zn-based oxide, mobility can be increased by reducing the defect density in the bulk.

A structure of an oxide semiconductor film is described below.

The oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example of the amorphous oxide semiconductor film is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when a CAAC-OS film including an $InGaZnO_4$ crystal is analyzed by an out-of-plane method, a peak appears frequently when the diffraction angle ($2\theta$) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when $2\theta$ is around 56°. This peak is derived from the (110) plane of the $InGaZnO_4$ crystal. Here, analysis ($\phi$ scan) is performed under conditions where the sample is rotated around a normal vector of a sample surface as an axis ($\phi$ axis) with $2\theta$ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when $\phi$ scan is performed with $2\theta$ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where the shape of the CAAC-OS film is changed by etching or the like, the c-axis might not be necessarily parallel to a normal vector of a formation surface or a normal vector of a top surface of the CAAC-OS film.

The degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak of $2\theta$ may also be observed at around 36°, in addition to the peak of $2\theta$ at around 31°. The peak of $2\theta$ at around 36° indicates that a crystal having no c-axis alignment is included in part of the CAAC-OS film. It is preferable that in the CAAC-OS film, a peak of $2\theta$ appear at around 31° and a peak of $2\theta$ do not appear at around 36°.

With the use of the CAAC-OS film in a transistor, change in electric characteristics of the transistor due to irradiation with visible light or ultraviolet light is small. Thus, the transistor has high reliability.

Note that an oxide semiconductor film may be a stacked film including two or more films of an amorphous oxide semiconductor film, a microcrystalline oxide semiconductor film, and a CAAC-OS film, for example.

For example, the CAAC-OS film is formed by sputtering with a polycrystalline metal oxide sputtering target. By collision of ions with the target, a crystal region included in the target may be separated from the target along an a-b plane; in other words, sputtered particles having a plane parallel to an a-b plane (flat-plate-like sputtered particle or pellet-like sputtered particle) may flake off from the target. In this case, the flat-plate-like sputtered particles reach a substrate while maintaining their crystal state, whereby the CAAC-OS film can be formed.

The CAAC-OS film is preferably deposited under the following conditions.

Decay of the crystal state due to impurities can be prevented by reducing the amount of impurities entering the CAAC-OS film during the deposition, for example, by reducing the concentration of impurities (e.g., hydrogen, water, carbon dioxide, and nitrogen) that exist in the deposition chamber or by reducing the concentration of impurities in a deposition gas. Specifically, a deposition gas with a dew point of −80° C. or lower, preferably −100° C. or lower is used.

By increasing the substrate temperature during the deposition, migration of a sputtered particle is likely to occur after the sputtered particle reaches a substrate surface. Specifically, the substrate temperature during the deposition ranges from 100° C. to 740° C., preferably from 200° C. to 500° C. By increasing the substrate temperature during the deposition, when the flat-plate-like sputtered particle reaches the substrate, migration occurs on the substrate surface; thus, a flat plane of the flat-plate-like sputtered particle is attached to the substrate.

It is preferable that the proportion of oxygen in the deposition gas be increased and the electric power be optimized in order to reduce plasma damage in the deposition. The proportion of oxygen in the deposition gas is 30 vol % or higher, preferably 100 vol %.

As an example of the target, an In—Ga—Zn-based oxide target is described below.

The polycrystalline In—Ga—Zn-based oxide target is made by mixing $InO_X$ powder, $GaO_Y$ powder, and $ZnO_Z$ powder in a predetermined molar ratio, applying pressure, and performing heat treatment at a temperature of 1000° C. to 1500° C. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder can be determined as appropriate depending on the desired target.

Alkali metal is not an element included in an oxide semiconductor and thus is an impurity. Likewise, alkaline earth metal is an impurity when the alkaline earth metal is not a component of the oxide semiconductor. When an insulating film in contact with an oxide semiconductor layer is an oxide, Na, among the alkali metals, diffuses into the insulating film and becomes $Na^+$. Further, in the oxide semiconductor layer, Na cuts or enters a bond between metal and oxygen which are components of the oxide semiconductor. As a result, the characteristics of the transistor deteriorate, for example, the transistor is placed in a normally-on state due to a negative shift of the threshold voltage or the mobility is decreased. In addition, the characteristics of transistors vary. Specifically, the measurement value of a Na concentration by secondary ion mass spectrometry is preferably $5 \times 10^{16}/cm^3$ or lower, further preferably $1 \times 10^{16}/cm^3$ or lower, still further preferably $1 \times 10^{15}/cm^3$ or lower. Similarly, the measurement value of a Li concentration is preferably $5 \times 10^{15}/cm^3$ or lower, further preferably $1 \times 10^{15}/cm^3$ or lower. Similarly, the measurement value of a K concentration is preferably $5 \times 10^{15}/cm^3$ or lower, further preferably $1 \times 10^{15}/cm^3$ or lower.

When metal oxide containing indium is used, silicon or carbon having higher bond energy with oxygen than indium might cut the bond between indium and oxygen, so that an oxygen vacancy may be formed. Accordingly, when silicon or carbon is contained in the oxide semiconductor layer, the electric characteristics of the transistor are likely to deteriorate as in the case of using alkali metal or alkaline earth metal. Thus, the concentrations of silicon and carbon in the oxide semiconductor layer are preferably low. Specifically, the C concentration or the Si concentration measured by secondary ion mass spectrometry is $1 \times 10^{18}/cm^3$ or lower. In this case, the deterioration of the electric characteristics of the transistor can be prevented, so that the reliability of a semiconductor device can be improved.

A metal in the source electrode and the drain electrode might extract oxygen from the oxide semiconductor layer depending on a conductive material used for the source and drain electrodes. In such a case, a region of the oxide semiconductor layer in contact with the source electrode or the drain electrode becomes an n-type region due to the formation of an oxygen vacancy.

The n-type region serves as a source region or a drain region, resulting in a decrease in the contract resistance between the oxide semiconductor layer and the source electrode or the drain electrode. Accordingly, the formation of the n-type region increases the mobility and on-state current of the transistor, which achieves high-speed operation of a switch circuit using the transistor.

Note that the extraction of oxygen by a metal in the source electrode and the drain electrode is probably caused when the source and drain electrodes are formed by sputtering or when heat treatment is performed after the formation of the source and drain electrodes.

The n-type region is more likely to be formed when the source and drain electrodes are formed using a conductive material that is easily bonded to oxygen. Examples of such a conductive material include Al, Cr, Cu, Ta, Ti, Mo, and W.

The oxide semiconductor layer is not limited to a single-layer metal oxide film and may have a stacked structure of a plurality of metal oxide films. In a semiconductor film in which first to third metal oxide films are sequentially stacked, for example, the first metal oxide film and the third metal oxide film are each an oxide film which contains at least one of the metal elements contained in the second metal oxide film and whose lowest conduction band energy is closer to the vacuum level than that of the second metal oxide film by 0.05 eV or more, 0.07 eV or more, 0.1 eV or more, or 0.15 eV or more and 2 eV or less, 1 eV or less, 0.5 eV or less, or 0.4 eV or less. Further, the second metal oxide film preferably contains at least indium in order to increase the carrier mobility.

In the transistor including the above semiconductor film, when a voltage is applied to the gate electrode so that an electric field is applied to the semiconductor film, a channel region is formed in the second metal oxide film, whose energy at the bottom of the conduction band is the lowest. That is, since the third metal oxide film is provided between the second metal oxide film and a gate insulating film, a channel region can be formed in the second metal oxide film that is insulated from the gate insulating film.

Since the third metal oxide film contains at least one of the metal elements contained in the second metal oxide film, interface scattering is unlikely to occur at the interface between the second metal oxide film and the third metal oxide film. Thus, the movement of carriers is unlikely to be inhibited at the interface, which results in an increase in the field-effect mobility of the transistor.

If an interface level is formed at the interface between the second metal oxide film and the first metal oxide film, a channel region is formed also in the vicinity of the interface, which causes a change in the threshold voltage of the transistor. However, since the first metal oxide film contains at least one of the metal elements contained in the second metal oxide film, an interface level is unlikely to be formed at the interface between the second metal oxide film and the first metal oxide film. Accordingly, the above structure can reduce variations in the electrical characteristics of the transistor, such as the threshold voltage.

Further, it is preferable that a plurality of metal oxide films be stacked so that an interface level due to impurities existing between the metal oxide films, which inhibits carrier flow, is not formed at the interface between the metal oxide films. This is because if impurities exist between the stacked metal oxide films, the continuity of the lowest conduction band energy between the metal oxide films is lost, and carriers are trapped or disappear by recombination in the vicinity of the interface. By reducing impurities existing between the films, a continuous junction (here, particularly a U-shape well structure whose lowest conduction band energy is changed continuously between the films) is formed more easily than the case of merely stacking a plurality of metal oxide films that contain at least one common metal as a main component.

In order to form continuous junction, the films need to be stacked successively without being exposed to the air by using a multi-chamber deposition system (sputtering system) provided with a load lock chamber. Each chamber of the sputtering system is preferably evacuated to a high vacuum (to about $5 \times 10^{-7}$ Pa to $1 \times 10^{-4}$ Pa) by an adsorption vacuum pump such as a cryopump so that water and the like acting as impurities for the oxide semiconductor are removed as much as possible. Alternatively, a combination of a turbo molecular pump and a cold trap is preferably used to prevent back-flow of a gas from an exhaust system into a chamber.

Not only high vacuum evaporation in a chamber but also high purity of a sputtering gas is necessary to obtain a high-purity intrinsic oxide semiconductor. As an oxygen gas or an argon gas used as the sputtering gas, a gas that is highly purified to have a dew point of −40° C. or lower, preferably −80° C. or lower, more preferably −100° C. or lower is used, so that entry of moisture or the like into the oxide semiconductor film can be prevented as much as possible.

For example, the first metal oxide film and/or the third metal oxide film can be an oxide film that contains aluminum, silicon, titanium, gallium, germanium, yttrium, zirconium, tin, lanthanum, cerium, or hafnium at a higher atomic ratio than the second metal oxide film. Specifically, the first metal oxide film and/or the third metal oxide film is preferably an oxide film with a content of any of the above elements 1.5 times or more, preferably 2 times or more, further preferably 3 times or more that of the second metal oxide film in an atomic ratio. The above element is strongly bonded to oxygen and thus has a function of suppressing generation of oxygen vacancies in the oxide film. Accordingly, the first metal oxide film and/or the third metal oxide film can be an oxide layer in which oxygen vacancies are less likely to be generated than in the second metal oxide film.

Specifically, when both the second metal oxide film and the first or third metal oxide film are In—M—Zn-based oxide films and the atomic ratio of the first or third metal oxide film is In:M:Zn=$x_1$:$y_1$:$z_1$ and that of the second metal oxide film is In:M:Zn=$x_2$:$y_2$:$z_2$, the atomic ratios are set so that $y_1/x_1$ is larger than $y_2/x_2$. Note that the element M is a metal element whose bonding strength to oxygen is larger than that of In, and can be Al, Ti, Ga, Y, Zr, Sn, La, Ce, Nd, or Hf, for example. The atomic ratios are preferably set so that $y_1/x_1$ is 1.5 times or more, preferably 2 times or more, further preferably 3 times or more $y_2/x_2$. Here, in the second metal oxide film, $y_2$ is preferably larger than or equal to $x_2$ because the transistor can have stable electrical characteristics. Note that the field-effect mobility of the transistor is reduced when $y_2$ is 3 times or more $x_2$; accordingly, $y_2$ is preferably smaller than 3 times $x_2$.

The thickness of first metal oxide film and the third metal oxide film ranges from 3 nm to 100 nm, preferably from 3 nm to 50 nm. The thickness of the second metal oxide film ranges from 3 nm to 200 nm, preferably from 3 nm to 100 nm, further preferably from 3 nm to 50 nm.

In the three-layer semiconductor film, the first to third metal oxide films can be amorphous or crystalline. Note that the transistor can have stable electrical characteristics when the second metal oxide film where a channel region is formed is crystalline; therefore, the second metal oxide film is preferably crystalline.

Note that a channel formation region refers to a region of a semiconductor film of a transistor that overlaps with a gate electrode and is located between a source electrode and a drain electrode. Further, a channel region refers to a region through which current mainly flows in the channel formation region.

For example, when an In—Ga—Zn-based oxide film formed by sputtering is used as the first and third metal oxide films, a sputtering target that is In—Ga—Zn-based oxide containing In, Ga, and Zn at an atomic ratio of 1:3:2 can be used to deposit the first and third metal oxide films. The deposition conditions can be as follows, for example: an argon gas (flow rate: 30 sccm) and an oxygen gas (flow rate: 15 sccm) are used as the deposition gas; the pressure is 0.4 Pa; the substrate temperature is 200° C.; and the DC power is 0.5 kW.

Further, when the second metal oxide film is a CAAC-OS film, a sputtering target including polycrystalline In—Ga—Zn-based oxide containing In, Ga, and Zn at an atomic ratio of 1:1:1 is preferably used to deposit the second metal oxide film. The deposition conditions can be as follows, for example: an argon gas (flow rate: 30 sccm) and an oxygen gas (flow rate: 15 sccm) are used as the deposition gas; the pressure is 0.4 Pa; the substrate temperature is 300° C.; and the DC power is 0.5 kW.

Note that the end portions of the semiconductor film in the transistor may be tapered or rounded.

Also in the case where a semiconductor film including stacked metal oxide films is used in the transistor, a region in contact with the source electrode or the drain electrode may be an n-type region. Such a structure increases the mobility and on-state current of the transistor and achieves high-speed operation of a semiconductor device. Further, when the semiconductor film including the stacked metal oxide films is used in the transistor, the n-type region particularly preferably reaches the second metal oxide film part of which is to be a channel region, because the mobility and on-state current of the transistor are further increased and higher-speed operation of the semiconductor device is achieved.

[Embodiment 7]

Figure 17:
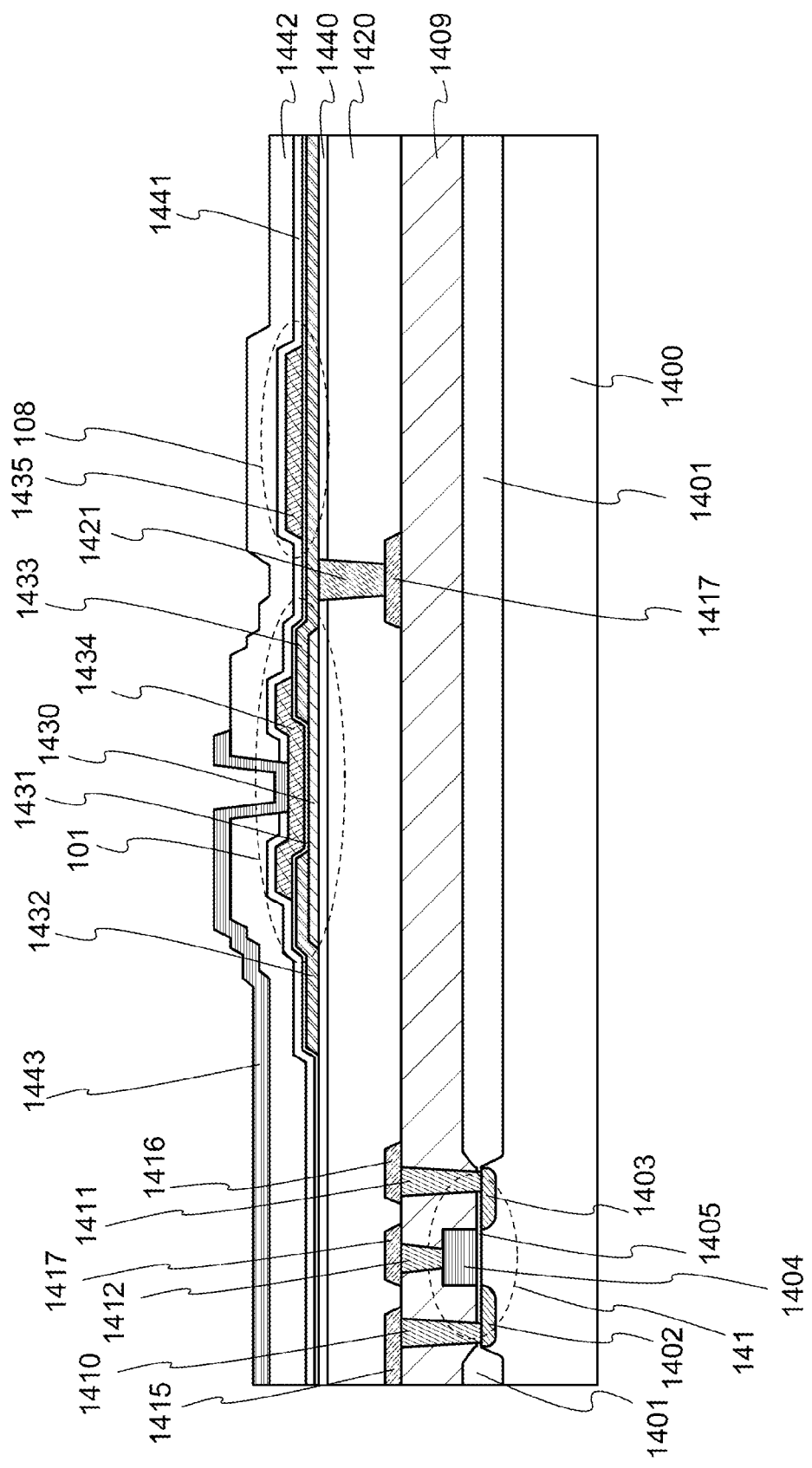
FIG. 17 is a cross-sectional view of a semiconductor device.

An example of the semiconductor devices shown in Embodiments 1 to 5 will be described. FIG. 17 illustrates an example of a cross-sectional structure of the transistor 101, the transistor 141, and the capacitor 108 included in the semiconductor device 100 illustrated in FIG. 1B.

The channel of the transistor 101 is formed in an oxide semiconductor layer. FIG. 17 shows the case where the transistor 101 and the capacitor 108 are formed over the transistor 141 that has a channel formation region in a single crystal silicon substrate.

Note that an active layer in the transistor 141 can be an amorphous, microcrystalline, polycrystalline, or signal crystal semiconductor film of silicon, germanium, or the like. Alternatively, the transistor 141 may include an active layer containing an oxide semiconductor. In the case where all of the transistors include an active layer containing an oxide semiconductor, the transistor 101 is not necessarily stacked over the transistor 141, and the transistors 101 and 141 may be formed in the same layer.

When the transistor 141 is formed using a thin silicon film, any of the following can be used, for example: amorphous silicon formed by sputtering or vapor phase growth such as plasma-enhanced CVD, polycrystalline silicon obtained by crystallization of amorphous silicon by laser irradiation, and single crystal silicon obtained by separation of a surface portion of a single crystal silicon wafer by implantation of hydrogen ions or the like into the silicon wafer.

Examples of a semiconductor substrate 1400 where the transistor 141 is formed are an n-type or p-type silicon substrate, germanium substrate, silicon germanium substrate, and compound semiconductor substrate (e.g., GaAs substrate, InP substrate, GaN substrate, SiC substrate, GaP substrate, GaInAsP substrate, and ZnSe substrate). As an example, FIG. 17 shows the case where an n-type single crystal silicon substrate is used.

The transistor 141 is electrically isolated from other transistors by an element isolation insulating film 1401. The element isolation insulating film 1401 can be formed by local oxidation of silicon (LOCOS), trench isolation, or the like.

Specifically, the transistor 141 includes impurity regions 1402 and 1403 that are formed in the semiconductor substrate 1400 and function as source and drain regions, a gate electrode 1404, and a gate insulating film 1406 between the semiconductor substrate 1400 and the gate electrode 1404. The gate electrode 1404 overlaps with a channel formation region formed between the impurity regions 1402 and 1403, with the gate insulating film 1405 placed therebetween.

An insulating film 1409 is provided over the transistor 141. Openings are formed in the insulating film 1409. A wiring 1410 in contact with the impurity region 1402, a wiring 1411 in contact with the impurity region 1403, and a wiring 1412 electrically connected to the gate electrode 1404 are formed in the openings.

The wiring 1410 is electrically connected to a wiring 1415 over the insulating film 1409. The wiring 1411 is electrically connected to a wiring 1416 over the insulating film 1409. The wiring 1412 is electrically connected to a wiring 1417 over the insulating film 1409.

An insulating film 1420 and an insulating film 1440 are formed to be stacked in this order over the wirings 1415 to 1417. An opening is formed in the insulating films 1420 and 1440. A wiring 1421 electrically connected to the wiring 1417 is formed in the opening.

In FIG. 17, the transistor 101 and the capacitor 108 are formed over the insulating film 1440.

The transistor 101 includes, over the insulating film 1440, a semiconductor film 1430 containing an oxide semiconductor; conductive films 1432 and 1433 that function as source and drain electrodes and are provided over the semiconductor film 1430; a gate insulating film 1431 over the semiconductor film 1430 and the conductive films 1432 and 1433; and a gate electrode 1434 that is provided over the gate insulating film 1431 and overlaps with the semiconductor film 1430 in the region between the conductive films 1432 and 1433. Note that the conductive film 1433 is electrically connected to the wiring 1421.

A conductive film 1435 is provided over the gate insulating film 1431 to overlap with the conductive film 1433. A portion where the conductive films 1433 and 1435 overlap with each other with the gate insulating film 1431 placed therebetween functions as the capacitor 108.

Although FIG. 17 illustrates an example where the capacitor 108 is provided over the insulating film 1440 together with the transistor 101, the capacitor 108 may be provided below the insulating film 1440 together with the transistor 141.

An insulating film 1441 and an insulating film 1442 are formed to be stacked in this order over the transistor 101 and the capacitor 108. An opening is formed in the insulating films 1441 and 1442. A conductive film 1443 that is in contact with the gate electrode 1434 in the opening is provided over the insulating film 1441.

In FIG. 17, the transistor 101 includes the gate electrode 1434 on at least one side of the semiconductor film 1430. Alternatively, the transistor 101 may include a pair of gate electrodes with the semiconductor film 1430 placed therebetween.

In the case where the transistor 101 has a pair of gate electrodes with the semiconductor film 1430 therebetween, one of the gate electrodes may be supplied with a signal for controlling the on/off state of the transistor 101, and the other of the gate electrodes may be supplied with a potential from another element. In this case, potentials with the same level may be supplied to the pair of gate electrodes, or a fixed potential such as the ground potential may be supplied only to the other of the gate electrodes. By controlling the level of a potential supplied to the other of the gate electrodes, the threshold voltage of the transistor can be controlled.

In FIG. 17, the transistor 101 has a single-gate structure in which one channel formation region corresponding to one gate electrode 1434 is provided. Alternatively, the transistor 101 may have a multi-gate structure in which a plurality of gate electrodes electrically connected to each other are provided and thus a plurality of channel formation regions are included in one active layer.

[Embodiment 8]

In this embodiment, a configuration of a CPU, which is a semiconductor device according to one embodiment of the present invention, will be described.

Figure 18:
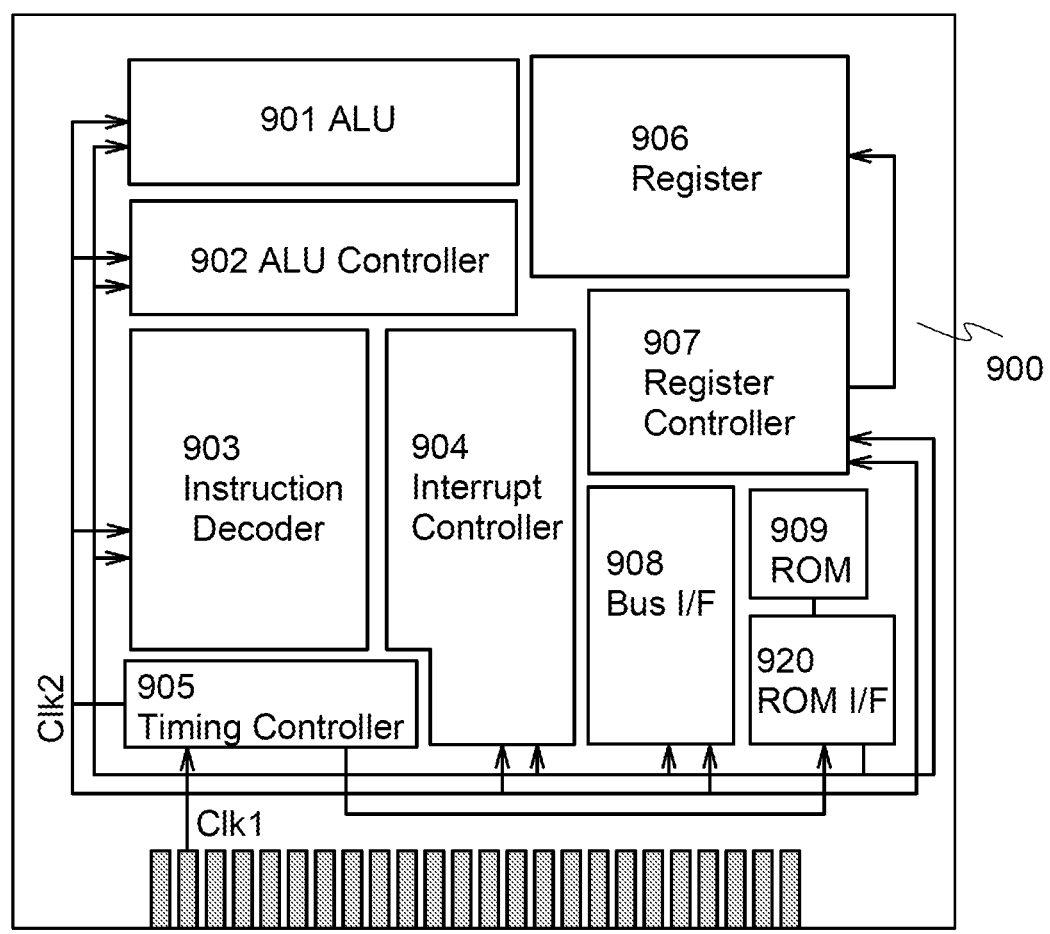
FIG. 18 is a block diagram of a CPU.

FIG. 18 illustrates a configuration of the CPU of this embodiment. The CPU illustrated in FIG. 18 mainly includes, over a substrate 900, an arithmetic logic unit (ALU) 901, an ALU controller 902, an instruction decoder 903, an interrupt controller 904, a timing controller 905, a register 906, a register controller 907, a bus interface (bus I/F) 908, a rewritable ROM 909, and a ROM interface (ROM I/F) 920. The ROM 909 and the ROM I/F 920 may be provided over another chip. The CPU in FIG. 18 is just an example in which the configuration is simplified, and actual CPUs have various configurations according to their intended purpose.

An instruction that is input to the CPU through the bus I/F 908 is input to the instruction decoder 903 and decoded therein, and then, input to the ALU controller 902, the interrupt controller 904, the register controller 907, and the timing controller 905.

The ALU controller 902, the interrupt controller 904, the register controller 907, and the timing controller 905 perform various controls based on the decoded instruction. Specifically, the ALU controller 902 generates signals for controlling the operation of the ALU 901. While the CPU is executing a program, the interrupt controller 904 judges an interrupt request from an external input/output device or a peripheral circuit on the basis of its priority or a mask state, and processes the request. The register controller 907 generates an address of the register 906, and reads/writes data from/to the register 906 in accordance with the state of the CPU.

The timing controller 905 generates signals for controlling operation timings of the ALU 901, the ALU controller 902, the instruction decoder 903, the interrupt controller 904, and the register controller 907. For example, the timing controller 905 is provided with an internal clock generator for generating an internal clock signal Clk2 based on a reference clock signal Clk1, and supplies the clock signal Clk2 to the above circuits.

In the CPU of this embodiment, the timing of Clk2 can be adjusted when it is different from the timing of Clk1.

This embodiment can be implemented in combination with any of the above embodiments as appropriate.

[Embodiment 9]

Although the conductive film and the semiconductor film described in the above embodiments can be formed by a sputtering method, they may be formed by another method, for example, a thermal CVD method. Examples of a thermal CVD method include metal organic chemical vapor deposition (MOCVD) and atomic layer deposition (ALD).

A thermal CVD method has an advantage that no defect due to plasma damage is generated since it does not utilize plasma for forming a film.

Deposition by a thermal CVD method may be performed in such a manner that a source gas and an oxidizer are supplied to a chamber at a time, the pressure in the chamber is set to an atmospheric pressure or a reduced pressure, and reaction is caused in the vicinity of a substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For instance, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, it is possible that the first source gas is exhausted by vacuum evacuation instead of the introduction of the inert gas, and then the second source gas is introduced. The first source gas is adsorbed on the surface of a substrate to form a first layer, and then the second source gas is introduced to react with the first layer. As a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetitions of the sequence of the gas introduction; thus, an ALD method makes it possible to accurately adjust a thickness and thus is suitable for manufacturing a minute FET.

The conductive film and the semiconductor film that are described in the above embodiment can be formed by a thermal CVD method such as a MOCVD method or an ALD method. For example, in the case where an In—Ga—Zn—O film is formed, trimethylindium, trimethylgallium, and dimethylzinc are used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium and diethylzinc (chemical formula: $Zn(C_2H_5)_2$) can be used instead of dimethylzinc.

For example, in the case where a tungsten film is formed using a deposition apparatus employing ALD, a $WF_6$ gas and a $B_2H_6$ gas are sequentially introduced plural times to form an initial tungsten film, and then a $WF_6$ gas and an $H_2$ gas are introduced at a time, so that a tungsten film is formed. Note that a $SiH_4$ gas may be used instead of a $B_2H_6$ gas.

In the case where an oxide semiconductor film, for example, an In—Ga—Zn—O film is formed using a deposition apparatus employing ALD, an $In(CH_3)_3$ gas and an $O_3$ gas are sequentially introduced plural times to form an In—O layer, a $Ga(CH_3)_3$ gas and an $O_3$ gas are introduced at a time to form a GaO layer, and then a $Zn(CH_3)_2$ gas and an $O_3$ gas are introduced at a time to form a ZnO layer. Note that the order of these layers is not limited to this example. A mixed compound layer such as an In—Ga—O layer, an In—Zn—O layer, or a Ga—Zn—O layer may be formed by mixing of these gases. Note that although an $H_2O$ gas obtained by bubbling with an inert gas such as Ar may be used instead of an $O_3$ gas, it is preferable to use an $O_3$ gas, which does not contain H. Further, instead of an $In(CH_3)_3$ gas, an $In(C_2H_5)_3$ gas may be used. Instead of a $Ga(CH_3)_3$ gas, a $Ga(C_2H_5)_3$ gas may be used. Instead of an $In(CH_3)_3$ gas, an $In(C_2H_5)_3$ may be used. Furthermore, a $Zn(CH_3)_2$ gas may be used.

The structure described in this embodiment can be combined as appropriate with any of the structures described in the other embodiments.

[Embodiment 10]

The semiconductor device of one embodiment of the present invention can be used for display devices, personal computers, and image reproducing devices provided with recording media (typically, devices that reproduce the content of recording media such as digital versatile discs (DVDs) and have displays for displaying the reproduced images). Other examples of electronic devices that can be equipped with the semiconductor device of one embodiment of the present invention are mobile phones, game machines including portable game consoles, portable information appliances, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 19A to 19F illustrate specific examples of such electronic devices.

Figure 19A:
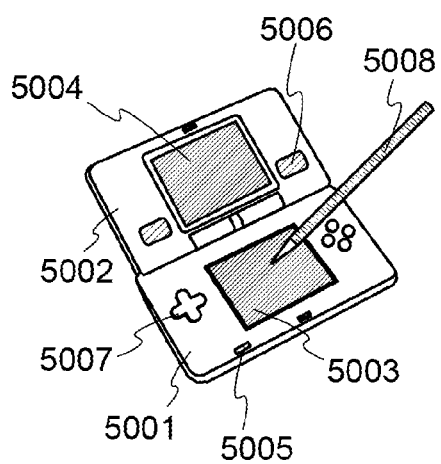
FIGS. 19A to 19F each illustrate an electronic device.

FIG. 19A illustrates a portable game console including a housing 5001, a housing 5002, a display portion 5003, a display portion 5004, a microphone 5005, speakers 5006, a control key 5007, a stylus 5008, and the like. Although the portable game console illustrated in FIG. 19A has the two display portions 5003 and 5004, the number of display portions included in the portable game console is not limited to this.

Figure 19B:
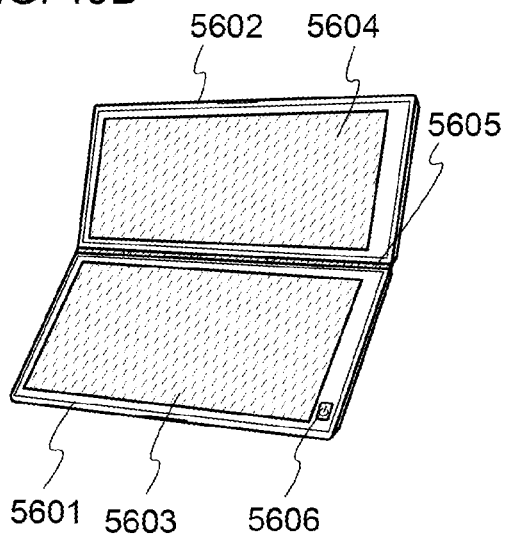

FIG. 19B illustrates a portable information appliance including a first housing 5601, a second housing 5602, a first display portion 5603, a second display portion 5604, a joint 5605, an operation key 5606, and the like. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. Images displayed on the first display portion 5603 may be switched in accordance with the angle at the joint 5605 between the first housing 5601 and the second housing 5602. A display device with a position input function may be used as at least one of the first display portion 5603 and the second display portion 5604. Note that the position input function can be added by provision of a touch panel in a display device. Alternatively, the position input function can be added by provision of a photoelectric conversion element called a photosensor in a pixel area of a display device.

Figure 19C:
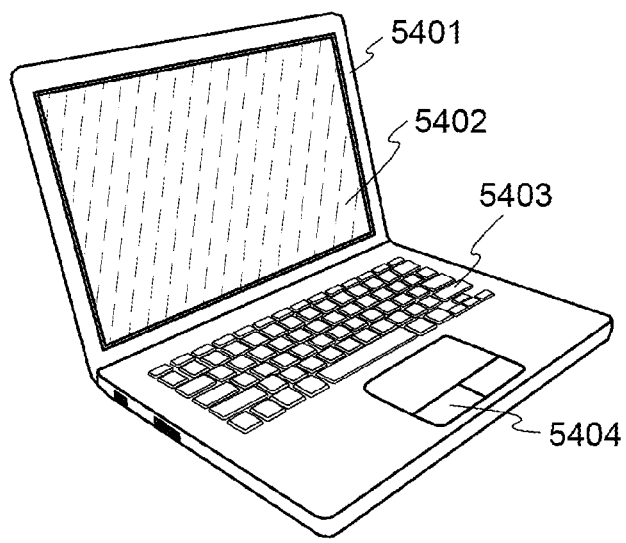

FIG. 19C illustrates a laptop including a housing 5401, a display portion 5402, a keyboard 5403, a pointing device 5404, and the like.

Figure 19D:
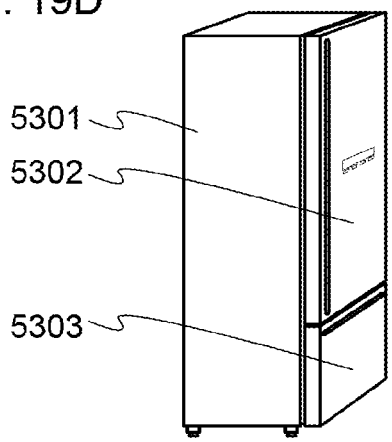

FIG. 19D illustrates an electric refrigerator-freezer including a housing 5301, a refrigerator door 5302, a freezer door 5303, and the like.

Figure 19E:
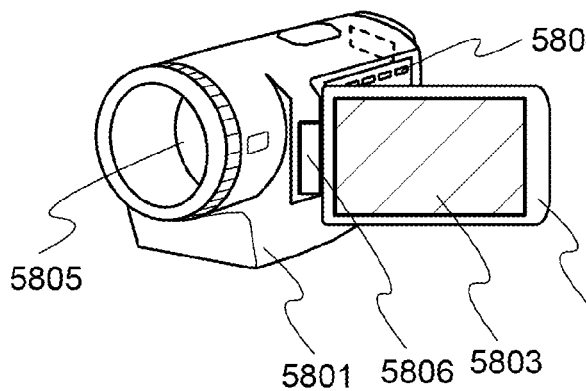

FIG. 19E illustrates a video camera including a first housing 5801, a second housing 5802, a display portion 5803, operation keys 5804, a lens 5805, a joint 5806, and the like. The operation keys 5804 and the lens 5805 are provided in the first housing 5801, and the display portion 5803 is provided in the second housing 5802. The first housing 5801 and the second housing 5802 are connected to each other with the joint 5806, and the angle between the first housing 5801 and the second housing 5802 can be changed with the joint 5806. Images displayed on the display portion 5803 may be switched in accordance with the angle at the joint 5806 between the first housing 5801 and the second housing 5802.

Figure 19F:
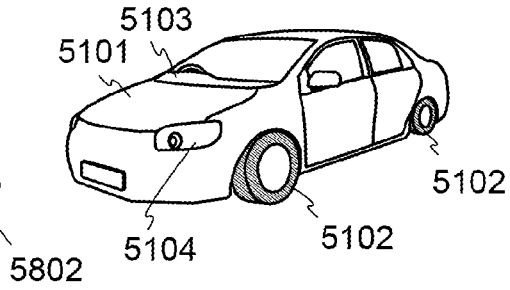

FIG. 19F illustrates a passenger car including a car body 5101, wheels 5102, a dashboard 5103, lights 5104, and the like.

This application is based on Japanese Patent Application serial No. 2013-010783 filed with Japan Patent Office on Jan. 24, 2013, the entire contents of which are hereby incorporated by reference.

What is claimed is:

1. A semiconductor device comprising:
   a first transistor;
   a circuit including a second transistor;
   a flip-flop; and
   a logic circuit,
   wherein a channel of the first transistor is included in an oxide semiconductor layer,
   wherein an output of the logic circuit is input to a gate of the first transistor,
   wherein a first signal is input to one of a source and a drain of the first transistor,
   wherein the other of the source and the drain of the first transistor is electrically connected to a gate of the second transistor,
   wherein a first clock signal is input to the circuit,
   wherein a second clock signal is output from the circuit to the flip-flop,
   wherein a second signal and an output signal of the flip-flop are input to the logic circuit, and
   wherein a timing of the second clock signal is different from a timing of the first clock signal.

2. The semiconductor device according to claim 1, wherein part of the second transistor is formed in a semiconductor substrate.

3. The semiconductor device according to claim 2, wherein the oxide semiconductor layer is formed over the semiconductor substrate.

4. The semiconductor device according to claim 1, incorporated in one selected from the group consisting of a portable game console, a portable information appliance, a laptop, an electric refrigerator-freezer, a video camera, and a passenger car.

5. A semiconductor device comprising:
   a first transistor;
   a circuit including a second transistor;
   a flip-flop;
   a combinational circuit electrically connected to the flip-flop; and
   a logic circuit,
   wherein a channel of the first transistor is included in an oxide semiconductor layer,
   wherein an output of the logic circuit is input to a gate of the first transistor,
   wherein a first signal is input to one of a source and a drain of the first transistor,
   wherein the other of the source and the drain of the first transistor is electrically connected to a gate of the second transistor,
   wherein a first clock signal is input to the circuit,
   wherein a second clock signal is output from the circuit to the flip-flop,
   wherein a second signal and an output signal of the flip-flop are input to the logic circuit, and
   wherein a timing of the second clock signal is different from a timing of the first clock signal.

6. The semiconductor device according to claim 5, wherein part of the second transistor is formed in a semiconductor substrate.

7. The semiconductor device according to claim 6, wherein the oxide semiconductor layer is formed over the semiconductor substrate.

8. The semiconductor device according to claim 5, incorporated in one selected from the group consisting of a portable game console, a portable information appliance, a laptop, an electric refrigerator-freezer, a video camera, and a passenger car.

* * * * *